US011029889B1

(12) United States Patent
Sharon et al.

(10) Patent No.: US 11,029,889 B1
(45) Date of Patent: Jun. 8, 2021

(54) SOFT BIT READ MODE SELECTION FOR NON-VOLATILE MEMORY

(71) Applicant: Western Digital Technologies, Inc., San Jose, CA (US)

(72) Inventors: Eran Sharon, Rishon Lezion (IL); Alex Bazarsky, Holon (IL); Idan Alrod, Herzliya (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 11 days.

(21) Appl. No.: 16/723,192

(22) Filed: Dec. 20, 2019

(51) Int. Cl.
| | |
|---|---|
| *G06F 3/06* | (2006.01) |
| *G11C 16/08* | (2006.01) |
| *G06F 11/10* | (2006.01) |
| *G11C 13/00* | (2006.01) |
| *G11C 16/26* | (2006.01) |

(52) U.S. Cl.
CPC .......... *G06F 3/0659* (2013.01); *G06F 3/0604* (2013.01); *G06F 3/0634* (2013.01); *G06F 3/0679* (2013.01); *G06F 11/1068* (2013.01); *G11C 13/004* (2013.01); *G11C 13/0026* (2013.01); *G11C 13/0028* (2013.01); *G11C 16/08* (2013.01); *G11C 16/26* (2013.01); *G11C 2013/0045* (2013.01)

(58) Field of Classification Search
None
See application file for complete search history.

(56) References Cited

U.S. PATENT DOCUMENTS

| | | | |
|---|---|---|---|
| 7,920,422 B2 | 4/2011 | Mokhlesi | |
| 9,530,513 B1 | 12/2016 | Pan et al. | |
| 2011/0235420 A1* | 9/2011 | Sharon | G11C 16/3454 365/185.17 |
| 2014/0071761 A1 | 3/2014 | Sharon et al. | |
| 2016/0093373 A1* | 3/2016 | Siau | G11C 16/32 365/148 |
| 2017/0117053 A1 | 4/2017 | Sharon et al. | |
| 2017/0345510 A1 | 11/2017 | Achtenberg et al. | |

* cited by examiner

*Primary Examiner* — Tan T. Nguyen
(74) *Attorney, Agent, or Firm* — Kunzler Bean & Adamson, PC

(57) ABSTRACT

Apparatuses, systems, and methods are presented for reading data. A controller may be configured to select a read mode from a plurality of read modes for reading data from a region of a non-volatile memory array. The plurality of read modes may include at least a time-based soft bit read mode. The controller may be configured to apply a set of bias conditions to cells of a region so that bit line currents associated with the cells of the region affect voltages at capacitors associated with the cells of the region. The controller may be configured to, in response to selecting a time-based soft bit read mode, read hard bits and soft bits for a region by sensing capacitor voltages resulting from an applied set of bias conditions, at multiple integration times.

20 Claims, 8 Drawing Sheets

US 11,029,889 B1

SOFT BIT READ MODE SELECTION FOR NON-VOLATILE MEMORY

TECHNICAL FIELD

The present disclosure, in various embodiments, relates to non-volatile memory and more particularly relates to reading soft bit information for non-volatile memory.

BACKGROUND

Various types of non-volatile memory store data by altering physical or electrical properties of non-volatile memory cells. A range of possible values for a physical or electrical property such as a stored charge, a threshold voltage, a magnetization, a resistance, or the like may be divided into states so that cells in different states record different data values. Data stored by altering the state of a cell may be read by sensing the state of a cell in relation to read thresholds that define boundaries between states.

However, the alterable physical or electrical property of a cell may shift after a write operation for various reasons, such as charge leakage or other forms of energy dissipation, disturbances from reading or writing to nearby cells, temperature effects, or the like. If the stored value of a cell shifts across a boundary between states, sensing the state of the cell may produce an erroneous data value that differs from the data value originally stored in the cell.

To mitigate or avoid such errors, data may be encoded with an error correcting code that adds redundant data, before writing the encoded data to the cells. An error correcting code decoder may use hard bits and soft bits to decode and recover the original data, where the hard bits are the encoded data as read (including redundant bits and possible errors), and where the soft bits indicate confidence in or reliability of the hard bits. For example, hard bits may be obtained by sensing states of cells in relation to the "hard" read thresholds that define boundaries between states, and soft bits may be obtained by sensing states of cells in relation to additional "soft" read thresholds to determine whether the stored values of cells have drifted near, or possibly across, a boundary between states. However, using additional time to sense cell states relative to additional read thresholds may significantly increase read latency.

SUMMARY

Apparatuses are presented for reading data. An apparatus, in some embodiments, includes an array of non-volatile memory cells and a controller. In some embodiments, a controller is configured to select a read mode from a plurality of read modes for reading data from a region of the array. In further embodiments, a plurality of read modes includes at least a time-based soft bit read mode. In some embodiments, a controller is configured to apply a set of bias conditions to cells of a region so that bit line currents associated with the cells of the region affect voltages at capacitors associated with the cells of the region. In some embodiments, a controller is configured to, in response to selecting a time-based soft bit read mode, read hard bits and soft bits for a region by sensing capacitor voltages resulting from an applied set of bias conditions, at multiple integration times.

Methods are presented for reading data. A method, in some embodiments, includes determining whether to use a time-based soft bit read mode for reading data from a region of non-volatile memory. In some embodiments, a method includes applying a set of bias voltages to cells of a region so that states of the cells affect analog voltages at sense amplifiers associated with the cells. In some embodiments, in response to determining to use a time-based soft bit read mode, a method includes reading hard bits and soft bits for a region by converting analog voltages affected by applied bias voltages to digital sense amplifier results, at multiple integration times.

An apparatus, in another embodiment, includes means for selecting a read mode from a plurality of read modes for reading data from a region of non-volatile memory. In further embodiments, a plurality of read modes includes at least a time-based soft bit read mode. In some embodiments, an apparatus includes means for producing analog voltages based on data stored by cells of a region. In further embodiments, an apparatus includes means for digitizing analog voltages at a number of integration times based on the selected read mode.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
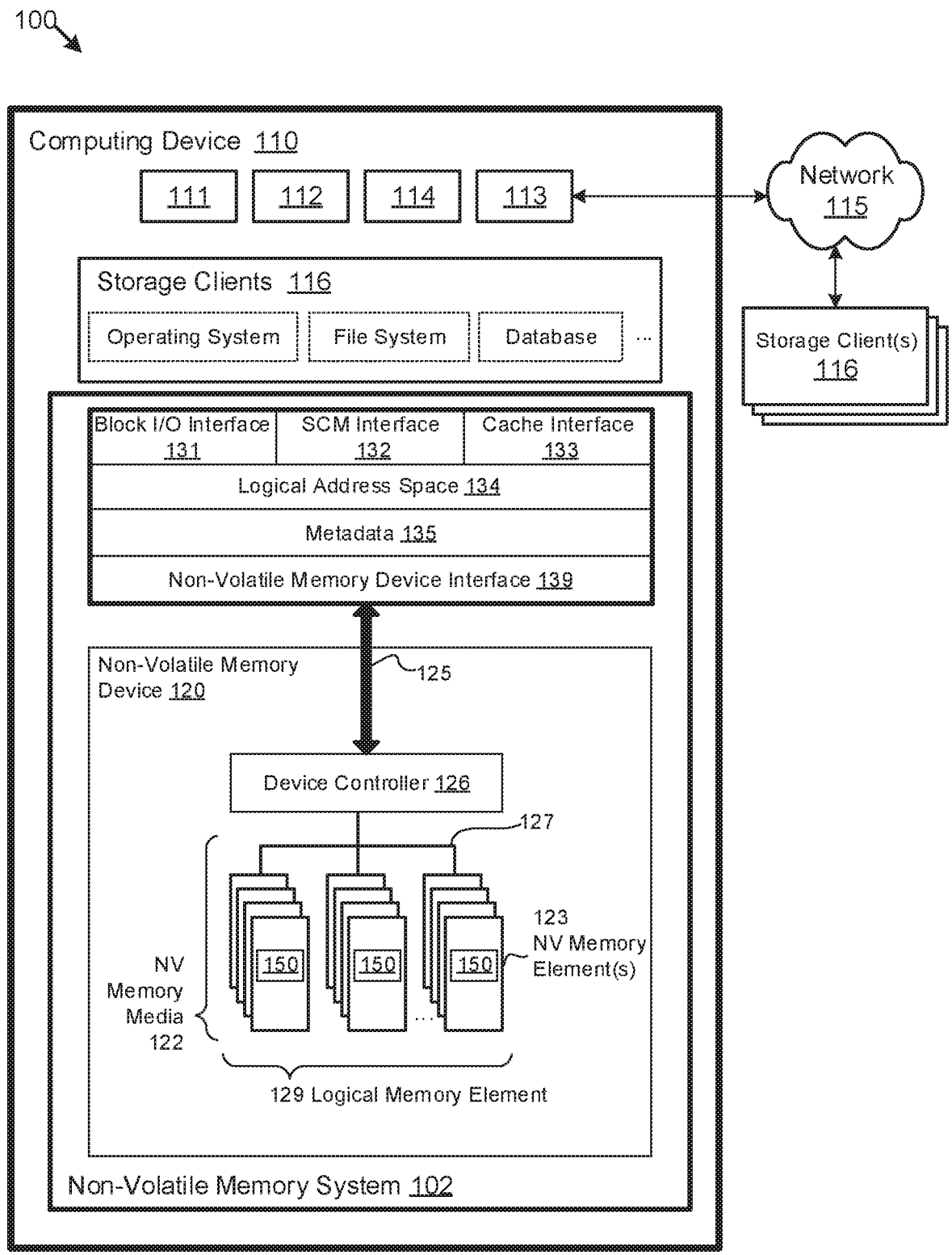
FIG. 1 is a schematic block diagram illustrating one embodiment of a system comprising read components.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

FIG. 1 is a block diagram of one embodiment of a system 100 comprising read components 150 for a non-volatile memory device 120. The read components 150 may be part of non-volatile memory elements 123, and may be in communication with a device controller 126 external to the non-volatile memory elements 123, a device driver, or the like. The read components 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein.

In the depicted embodiment, the non-volatile memory elements 123 include read components 150. In some embodiments, non-volatile memory elements 123 may store data in memory cells by altering physical or electrical properties of the cells. Different states for cells may correspond to different data values. In some embodiments, a read component 150 may read data of a non-volatile memory element 123 by applying bias conditions to memory cells via bit lines, word lines, source lines, and/or the like, so that electrical currents in bit lines are affected by cell states. Thus, different bit line currents may correspond to different stored data values. For example, a current above a threshold may indicate that a stored data value is a binary "0," and a current below the threshold may indicate that the stored data value is a binary "1."

In some embodiments, small differences in bit line currents may be sensed or amplified by summing up or integrating the bit line currents over a certain time period. For example, bit lines may be coupled to capacitors that are charged or discharged by bit line currents, so that capacitor voltages sum up or integrate the bit line currents over time. After an integration time, analog capacitor voltages may be sensed to produce digital data values. For example, a capacitor voltage may be compared to a reference voltage, applied to the gate of a transistor to determine if the capacitor voltage turns the transistor on or off, or the like, to produce a binary zero or one. Various other or further types of hardware may be used to convert bit line currents to analog voltages and then to digital data values.

However, a memory cell's physical or electrical property that is altered to record data may shift after the data is written for various reasons, such as charge leakage or other forms of energy dissipation, disturbances from reading or writing to nearby cells, temperature effects, or the like. If the alterable cell property shifts across a boundary between states, a read component 150 may read erroneous data from the cell. Encoding data with an error correcting code prior to storing the data may add redundancy, allowing the original data to be decoded despite the presence of some errors. A decoder may use hard bits and soft bits to decode and recover the original data, where the hard bits are the encoded data as read (including redundant bits and possible errors), and where the soft bits indicate confidence in or reliability of the hard bits.

In some embodiments, a read component 150 may read hard bits from cells using the process described above of applying bias conditions to memory cells so that bit line currents affect capacitor voltages that are sensed or converted to binary outputs after an integration time. In further embodiments a read component 150 may read soft bits by repeating the same process with different bias conditions. For example, a read component 150 may output different soft bit values indicating whether a corresponding hard bit is less reliable or more reliable, depending on whether a small increase or decrease to a bias voltage for a cell changes the resulting hard bit output or leaves the hard bit output unchanged. However, multiple repetitions of the process of applying bias conditions and sensing results may significantly increase read latency for a non-volatile memory element 123.

Thus, in some embodiments, a read component 150 may read hard bits and soft bits by applying bias conditions to memory cells so that bit line currents affect capacitor voltages, and by sensing or digitizing the resulting capacitor voltages at multiple integration times. Applying bias conditions to the cells once and sensing the resulting capacitor voltages at multiple times may allow a read component 150 to read hard bits and soft bits in less time than it would take to read the soft bits by repeatedly applying different bias conditions and sensing the resulting capacitor voltages.

Additionally, in some embodiments, a read component 150 may provide or select between multiple read modes with different tradeoffs between reliability and speed. For example, a read component 150 may provide a higher-speed, lower-reliability hard bit read mode in which it does not read soft bits, an intermediate-speed, intermediate-reliability time-based soft bit read mode in which the read component 150 reads hard bits and soft bits by sensing capacitor voltages resulting from a single application of bias conditions, with the voltages sensed at multiple integration times, and/or a bias-based soft bit read mode in which the read component 150 reads hard bits and soft bits by repeatedly applying different bias conditions and sensing the resulting capacitor voltages.

In some embodiments, a read component 150 may select a read mode for reading data from a region of a non-volatile memory array (e.g., an array in a non-volatile memory element 123). The read component 150 may select the read mode from a plurality of read modes including at least a time-based soft bit read mode. In some embodiments, a read component 150 may apply a set of bias conditions (e.g., one or more bias voltages) to cells of a region, so that bit line currents associated with cells of the region affect voltages at capacitors associated with cells of the region. In response to selecting the time-based soft bit read mode, the read component 150 may read hard bits and soft bits for a region by sensing capacitor voltages resulting from the applied set of bias conditions, at multiple integration times. Providing multiple read modes may allow a read component 150 to avoid high-latency read times or high error rates by selecting a read mode based on conditions such as time since writing data, temperature difference since writing data, or the like. Read components 150 are described in further detail below with reference to FIGS. 2-12.

In one embodiment, the non-volatile memory device 120 is configured to receive storage requests from a device driver or other executable application via buses 125, 127, a device controller 126, or the like. The non-volatile memory device 120 may be further configured to transfer data to/from a device driver and/or storage clients 116 via the bus 125. Accordingly, the non-volatile memory device 120, in some embodiments, may comprise and/or be in communication with one or more direct memory access (DMA) modules, remote DMA modules, bus controllers, bridges, buffers, and so on to facilitate the transfer of storage requests and associated data. In another embodiment, the non-volatile memory device 120 may receive storage requests as an API call from a storage client 116, as an IO-CTL command, or the like.

According to various embodiments, a device controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective device controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, may comprise block and/or page addressable memory technologies such as NAND flash, or may comprise byte addressable storage class memory (SCM).

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element 123, a non-volatile storage element, or the like.

The non-volatile memory media 122 may comprise one or more non-volatile memory elements 123, which may include, but are not limited to: chips, packages, planes, die, or the like. A device controller 126, external to the one or more non-volatile memory elements 123, may be configured to manage data operations on the non-volatile memory media 122, and may comprise one or more processors, programmable processors (e.g., FPGAs), ASICs, microcontrollers, or the like. In some embodiments, the device controller 126 is configured to store data on and/or read data from the non-volatile memory media 122, to transfer data to/from the non-volatile memory device 120, and so on.

The device controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements 123.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the device controller 126 over a bus 125, as described above.

Figure 2:
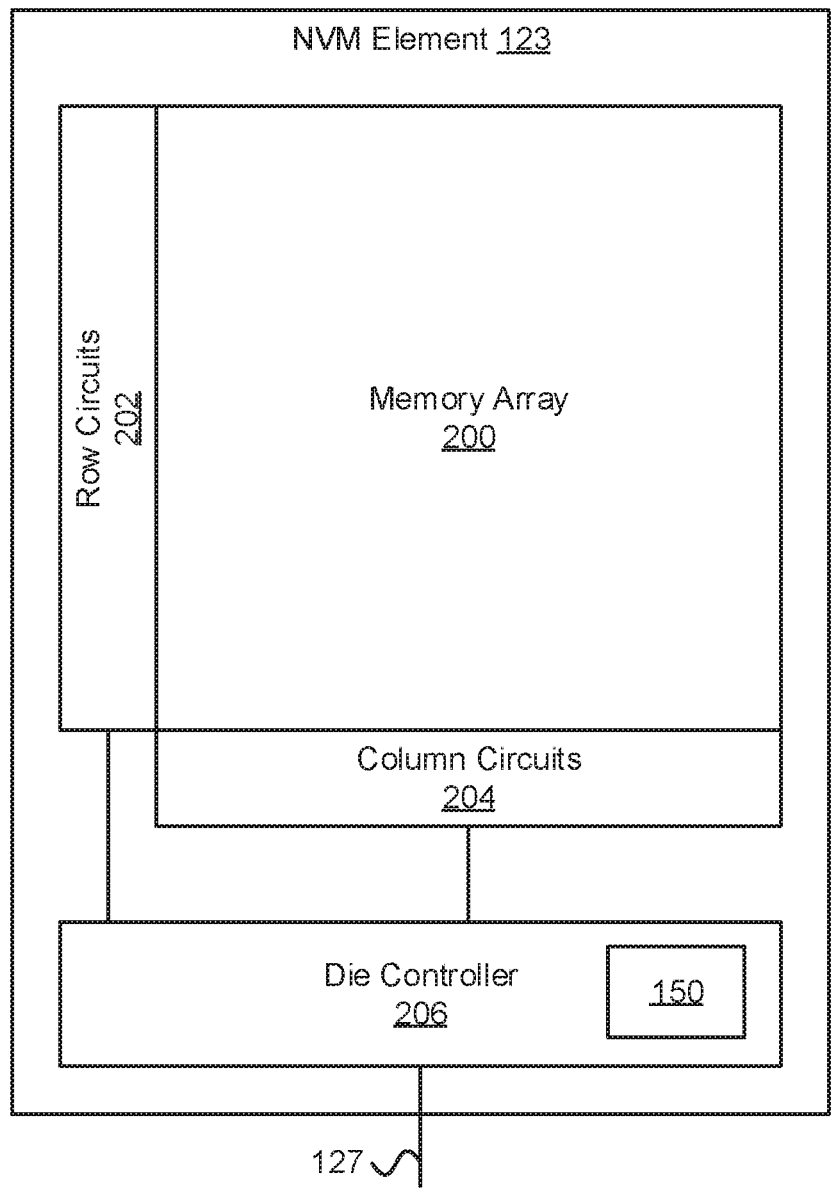
FIG. 2 is a schematic block diagram illustrating one embodiment of a non-volatile memory element comprising a read component.

FIG. 2 depicts one embodiment of a non-volatile memory element 123. The non-volatile memory element 123 may be substantially similar to the non-volatile memory element 123 described above with reference to FIG. 1, and may be a chip, a die, a die plane, or the like. In the depicted embodiment, the non-volatile memory element 123 includes a memory array 200, row circuits 202, column circuits 204, and a die controller 206.

In various embodiments, a non-volatile memory element 123 may be an integrated circuit that includes both a core array 200 of memory cells (e.g., non-volatile memory cells) for data storage, and peripheral components (e.g., row circuits 202, column circuits 204, and/or die controller 206) for communicating with the array 200. In certain embodiments, one or more non-volatile memory elements 123 may be included in non-volatile memory device 120.

In the depicted embodiment, the array 200 includes a plurality of memory cells. In one embodiment, the array 200 may be a two-dimensional array. In another embodiment, the array 200 may be a three-dimensional array that includes multiple planes and/or layers of memory cells. In various embodiments, the array 200 may be addressable by rows via row circuits 202, and by columns via column circuits 204.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder that translates a received address to a hardware address used by the row circuits 202 and column circuits 204, a state machine that implements and controls the memory operations, and the like. The die controller 206 may communicate with a computing device 110, a processor 115, a bus controller, a storage device controller, a memory module controller, or the like, via bus 127, to receive command and address information, transfer data, or the like.

In one embodiment, the die controller 206 may include a read component 150, which may substantially similar to the read component 150 described above with reference to FIG. 1. Although the read component 150 is depicted in FIG. 2 as a component of the die controller 206, a read component 150 in some embodiments may include or communicate with components of row circuits 202, column circuits 204 or the like. For example, in some embodiments, bias circuits for applying bias conditions to word lines and bit lines may be included in the row circuits 202 and column circuits 204, and the read component 150 may include or communicate with the bias circuits.

Figures 3, 4:
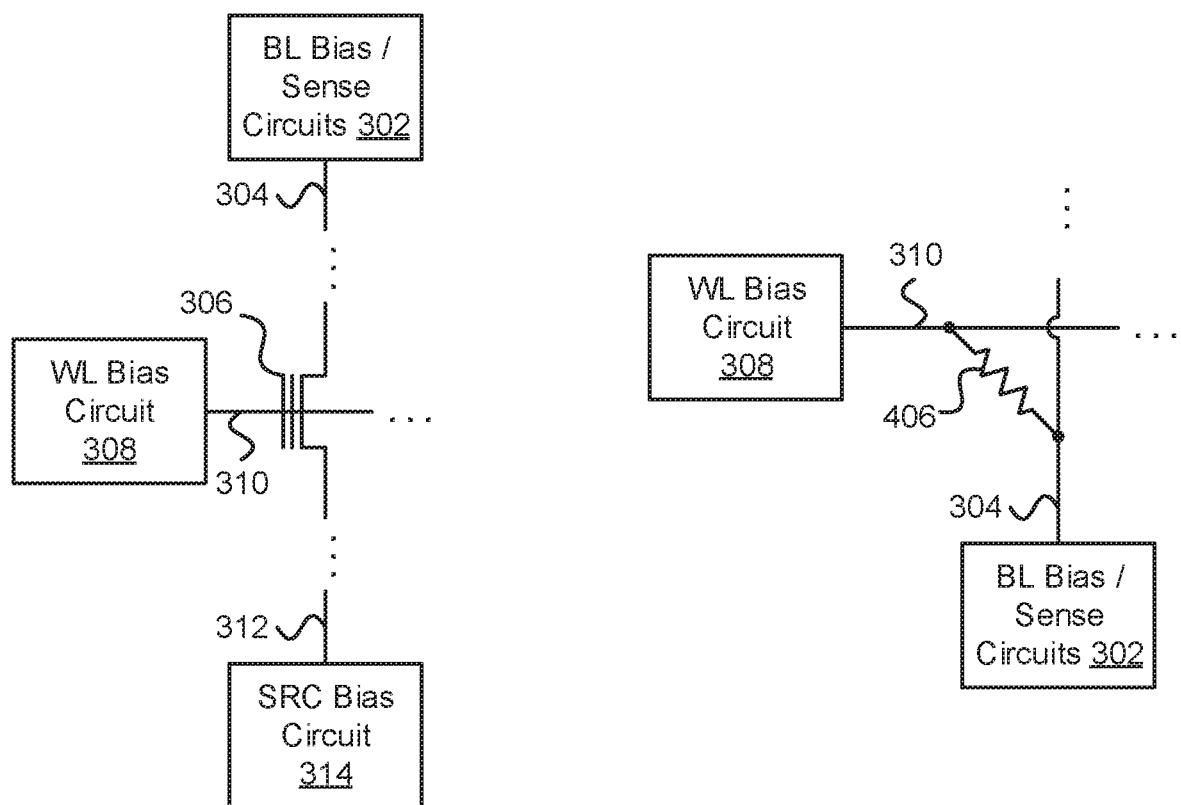
FIG. 3 is a schematic block diagram illustrating one embodiment of a non-volatile memory cell and associated bias circuits.
FIG. 4 is a schematic block diagram illustrating another embodiment of a non-volatile memory cell and associated bias circuits.

FIGS. 3 and 4 depict different embodiments of a non-volatile memory cell 306, 406, with associated bias circuits 302, 308, 314. FIG. 3 depicts a three-terminal memory cell 306, and FIG. 4 depicts a two-terminal memory cell 406. A memory array 200, as depicted in FIG. 2, may include multiple memory cells 306, 406, in rows, columns, and/or layers. In various embodiments, a read component 150 may read various types of memory cell 306, 406 by applying bias conditions to cells 306, 406 so that bit line currents charge or discharge capacitors, then by sensing the capacitor voltages.

FIG. 3 depicts one embodiment of a memory cell 306. In various embodiments, a "cell" may refer to a smallest or fundamental physical unit of memory, or storage, for an array 200, and may be referred to interchangeably as a "storage cell," a "memory cell" or the like. For example, a cell 306 may be a floating gate transistor for NAND flash memory, a memristor for resistive memory, or the like. Thus, in a further embodiment, an array 200 of cells 306 may be a two-dimensional grid, a three-dimensional block, a group, or other similar set of cells 306 where data can be physically stored, for short-term memory use, long-term storage use, or the like.

A physical or electrical property of a memory cell 306 may be alterable to store data. For example, transistor-based memory cells 306 (e.g., NAND) may store data based on an alterable threshold voltage for turning on the transistor. Similarly, resistive memory cells 406 (e.g., PCM or MRAM) may store data based on an alterable resistance. A range of possible values for a cell's alterable physical property may be divided into states, corresponding to data values.

In the depicted embodiment, the memory cell 306 is a floating-gate transistor (e.g., as used in NAND flash memory), where the threshold voltage at which the transistor turns "on" (e.g., switches from a non-conductive or low-current state into a conductive or high-current state when the voltage is applied to the transistor as a gate-to-source voltage) is alterable by altering the amount of charge trapped in a floating gate or charge trap, separated by oxide (or other dielectric) layers from the control gate and the substrate or channel.

In the depicted embodiment, the cell 306 is coupled to a word line bias circuit 308 via a word line 310, coupled to bit line bias/sense circuits 302 via a bit line 304, and coupled to a source bias circuit 314 via a source line 312. In various embodiments, bit line 304, word line 310, and/or source line 312 are conductors coupled to columns, rows, layers, or other regions of cells 306 in an array 200. Although a single cell 306 is depicted in FIG. 3, a word line 310 may couple a word line bias circuit 308 to multiple cells 306 across a row or layer of an array 200. Similarly, a bit line 304 and/or a source line 312 may be coupled to multiple cells 306 in a column of the array.

In one embodiment, bit lines 304, word lines 310, and source lines 312 may couple bias circuits 302, 308, 314 directly to cells 306 (e.g., with other cells 306 connected to the lines in parallel). In another embodiment, connections between bias circuits 302, 308, 314 and a cell 306 may be indirect, with a current path that passes through other cells 306 (or other components such as select transistors). For example, in NAND flash memory, cells 306 may be connected in a series string, with neighboring cells 306 in the string connected source-to-drain. The bit line 304 may couple bit line bias/sense circuits 302 to a cell 306 at one end of the string, and the source line 312 may couple the source bias circuit 314 to a cell 306 at the other end of the string. To read data from one of the cells 306 in the string, the other cells 306 in the string may be turned "on" (e.g., by applying sufficiently high gate voltages via word lines 310 for those cells 306), so that the cell 306 being read is coupled to the bit line bias/sense circuits 302 and the source bias circuit 314 via the bit line 304, the source line 312, and the other cells 306 in the string.

In various embodiments, a read component 150 may use bias circuits 302, 308, 314 to apply bias conditions to cells 306 of an array 200, or within a region of an array 200. In various embodiments, "bias conditions" may be bias voltages, bias currents, or the like. Bias conditions may be applied to cells 306 via bit lines 304, word lines 310, and/or source lines 312, or other types of lines that go to cells in other types of memory arrays 200. In some embodiments, a bias condition may be an initial condition for a read or sense operation, and may be a steady-state condition during the operation, such as a read voltage applied to a word line 310 during a sense operation, or may be a transient condition such as a bit line precharge voltage that is initially applied and then permitted to vary depending on the state of the cells 306. More generally, bias conditions may be any set of voltages, currents, or other conditions that, when applied to cells 306 in a region of a memory array 200, result in some other condition such as a bit line current or a capacitor voltage that depends on the state of one or more cells 306. Thus, a sense operation to determine what data value is stored by a cell 306 may include applying bias conditions and observing the resulting condition to determine the state of the cell 306.

In the depicted embodiment, where the threshold voltage that turns the cell 306 on is alterable to store data, the range of possible threshold voltages for the cell 306 is divided into states that correspond to data values. To read data from the cell 306, a read voltage is applied as a gate-to-source voltage. A drain-to-source voltage is applied, so that a current through the cell 306 is produced if the applied read voltage is above the threshold voltage for the cell 306. Conversely, if the applied read voltage is below the threshold voltage for the cell 306, the cell 306 is "off," and the current is zero (or is a non-zero leakage current lower than the current for the cell 306 in the "on" state). If the cell 306 stores a single bit, using a high-threshold-voltage state and a low-threshold-voltage state to represent a 0 and a 1, then applying a read voltage that matches the boundary between states may be sufficient to determine whether the threshold voltage for the cell 306 is above the read voltage, and therefore in the high-threshold voltage state, or below the read voltage, and therefore in the low-threshold-voltage state. If the cell 306 stores more than one bit (e.g., two bits using four states, three bits using eight states) further sensing by applying additional read voltages at boundaries between the additional states may allow the state of the cell 306 to be determined.

In the depicted embodiment, the cell 306 is in a NAND flash array 200, and the above described drain, gate, and source voltages are applied by the bias circuits 302, 308, 314, via bit lines 304, word lines 310, and source lines 312. In some embodiments, the bit line bias/sense circuits 302, word line bias circuit 308, and/or source bias circuit 314 may include components that produce bias conditions such as a bias voltage or bias current. Components that produce a bias voltage or other bias conditions may include voltage supplies, switching components to couple or decouple a node to a voltage supply, voltage regulators, charge pumps, level shifters, or the like. Various other or further components may be included in bias circuits 302, 308, 314. In some embodiments, bias circuits 302, 308, 314 may be controllable circuits capable of outputting multiple voltages. In some embodiments, however, one or more of the bias circuits 302, 308, 314 in the depicted embodiment may be implemented as a connection to a reference voltage. For example, in one embodiment, the source bias circuit 314 may simply connect the source line 312 to ground, VSS, or another reference voltage.

In the depicted embodiment, to read data from cells 306 in a NAND memory array 200, a word line bias circuit 308 applies a read voltage to control gates of a row of cells 306 via the word line 310. Word line bias circuits (not shown) for other rows of cells 306 apply a high voltage sufficient to turn those cells 306 "on" so that current through series strings of cells 306 is based on whether the read voltage applied to a row of cells 306 is above or below the threshold voltage for those cells 306. Source bias circuits 314 apply a source voltage (e.g., VSS, or zero volts) via source lines 312 for multiple columns or strings of cells 306. Bit line bias/sense circuits 302 apply drain voltages (e.g., bit line precharge voltages) via bit lines 304 for the columns or strings of cells 306. With these bias conditions applied to the cells 306, cells 306 coupled to the word line 310 will be on or off depending on whether the read voltage applied to the word line 310 is above or below the threshold voltage for each of those cells 306, and thus bit line currents (e.g., the electrical current in each of the bit lines 304) will depend on the states of the cells 306 in that row. In further embodiments, bit line bias/sense circuits 302 may include sense amplifiers that convert analog electrical properties at the bit lines 304, such as bit line voltages or currents, to digital results such as logic levels or data values.

FIG. 4 depicts another embodiment of a memory cell 406 In the depicted embodiment, the memory cell 406 is a resistive memory cell, where the resistance of the cell 406 is alterable to store data. For example, in one embodiment, a high-resistance state may correspond to a binary zero, while a low-resistance state corresponds to a binary one. In another embodiment, a cell 406 may store multiple bits using intermediate-resistance states. Resistive memory cells 406, in various embodiments, may include magnetoresistive memory cells, phase change memory cells, ovonic threshold switching memory cells, conductive-bridging memory cells, ReRAM cells, or the like. In the depicted embodiment, a word line bias circuit 308 is coupled to a row of cells 406 via a word line 310, and bit line bias/sense circuits 302 are coupled to a column of cells 406 via a bit line 304. The bit line bias/sense circuits 302, bit line 304, word line bias circuit 308, and word line 310 may be substantially as described above with reference to FIG. 3. However, with two-terminal resistive memory cells 406, current through a cell 406 may be a current between the word line 310 and the bit line 304, rather than between the bit line 304 and a source line 312. Thus, in the depicted embodiment, a source line 312 and a source bias circuit 314 are omitted.

In the depicted embodiment, to read data from cells 406 in an array 200, a word line bias circuit 308 applies a word line bias voltage to a row of cells 406 via the word line 310. Bit line bias/sense circuits 302 for columns of cells 406 apply bit line bias voltages to bit lines 304. With these bias conditions applied to the cells 406, bit line currents will depend on the voltage difference between the word line bias and the bit line bias voltages, and on the states of the cells 406. A high bit line current may indicate that a cell 406 is in a low-resistance state, while a low bit line current may indicate that a cell 406 is in a high-resistance state. As described above with reference to FIG. 3, the bit line bias/sense circuits 302 may include sense amplifiers that convert analog electrical properties at the bit lines 304, such as bit line voltages or currents, to digital results such as logic levels or data values. The sense amplifiers may digitize the analog bit line current to produce a digital data value.

In various embodiments, read thresholds may define boundaries between states. Different types of read thresholds may define states, or boundaries between states in different ways for different types of cells 306, 406. For example, as described above with reference to FIG. 3, where the threshold voltage of a transistor-based cell 306 is alterable to store data, a read threshold may be a voltage that separates the range of possible threshold voltages into states. Similarly, with reference to FIG. 4, where the resistance of a cell 406 is alterable to store data, a read threshold may be a resistance value that separates the range of possible resistances into states. However, in some embodiments, a read threshold may define boundaries between states without direct reference to the alterable property of the cell 306, 406 that is used to store data. For example, a read threshold that defines a boundary between a high-resistance state and a low-resistance state for resistive memory may be a current threshold where a current above the threshold corresponds to the low resistance state, so that the states are defined by a current rather than directly by a resistance. Various other or further types of read thresholds may be used to define states for cells 306, 406 of non-volatile memory.

Although FIGS. 3 and 4 depict three-terminal transistor-based cells 306 and two-terminal resistor-based cells 406, various other or further types of memory cells may be similarly biased. For example, three-terminal magnetoresistive memory may include separate read bit lines and write bit lines, and applying bias conditions for reading data from the cells may include inhibiting current in the write bit line (e.g., by operating a transistor to disconnect the write bit line). Additionally, in some embodiments, bias conditions may be applied to components that are not depicted in FIGS. 3 and 4. For example, applying bias conditions to cells may include applying select or deselect voltages to select transistors to select a row, column, plane, or other region of a memory array 200.

Figure 5:
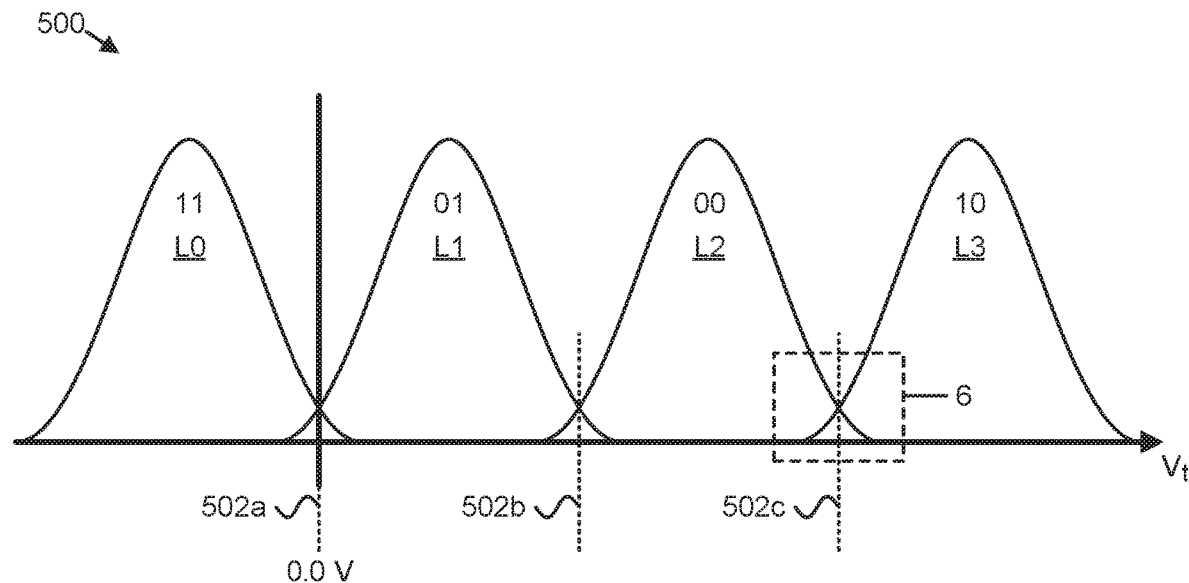
FIG. 5 is a graph illustrating a distribution of threshold voltages for cells of a non-volatile memory array, in one embodiment.

FIG. 5 is a graph 500 illustrating a distribution of threshold voltages for cells of a non-volatile memory array 200, in one embodiment. In the depicted embodiment, cells are flash memory cells where the threshold voltage Vt of a cell is alterable to store data, and range of possible values for the threshold voltage Vt is depicted on the horizontal axis of the graph 500. References to a threshold voltage Vt are provided as a non-limiting example. In another embodiment, a non-volatile memory array 200 may include another type of cell with another property that may be similarly divided into states to store data. For a given threshold voltage on the horizontal axis, the height of the line on the graph 500 indicates the number or proportion of cells with that threshold voltage.

In the depicted embodiment, the range of possible threshold voltages Vt for a NAND flash memory cell is divided into four subranges or states L0-L3 by read thresholds 502a-c, represented by vertical dashed lines. In another embodiment, a range of possible threshold voltages Vt for a NAND flash cell may be divided into more or fewer than four states. In the depicted embodiment, cells are erased into the lowest state L0, and may be programmed into higher states L1-L3. The states L0-L3 correspond to data values. For example, in the depicted embodiment, the four states L0, L1, L2, and L3 are mapped to the data values "11," "01," "00," and "10," respectively, so that the cell stores two bits of information. Various other mappings between cell states and data values may be used, in various embodiments. Sense operations may determine whether the threshold voltage Vt for a cell is above or below one of the read thresholds 502, and thereby determine the state of the cell and the corresponding data value. Sense operations may be performed as described above with reference to FIGS. 3 and 4, by applying bias conditions to cells so that a bit line current or another electrical result depends on the state of the cell.

The graph 500 indicates that cells are programmed or erased to produce a uniform distribution of threshold voltages among states L0-L3. In practice, the distribution of states for a set of cells may not be uniform. For example, if a long string of zeroes is written to a set of cells, more cells may be in the L2 state, which encodes "00" than in the other states. However, data compression or whitening algorithms may make the distribution of states substantially uniform over a large set of cells.

Although the distribution of threshold voltages for cells may be substantially uniform among states L0-L3, the distribution is depicted as forming a bell-shaped peak in each state. In some embodiments, a cell may be programmed by issuing voltage pulses that alter the threshold voltage Vt for the cell to be at or near a target voltage in the middle of the range of voltages that defines the state. Thus, a bell-shaped peak may be centered on the target programming voltage, or the like. The width of the peaks may be affected by variations in the cells and the programming process, or by error-causing phenomena such as read disturbs, program disturbs, stress-induced leakage current, or the like. Although symmetric, bell-shaped peaks are shown, skewed distributions and other distributions are possible. Over time, the distributions may widen or skew as the threshold voltage of cells move from their originally programmed values. Additionally, distributions may shift due to temperature. For example, the threshold voltage of a transistor may be temperature dependent, so that the location and width of the peaks changes depending on the current temperature.

In the depicted graph 500, each peak represents the distribution of cells originally programmed to a particular state. Thus, there are four peaks corresponding to the four L0-L3 states. However, cells originally programmed to threshold voltages in one state may, after some amount of time, have drifted to have threshold voltages in another state. Thus, the individual peaks significantly overlap each other at or near the read thresholds 502. (The overall distribution for cells of the array may be a sum of the peaks depicted for cells programmed to each state). A sense operation that determines the current state of a cell relative to the read thresholds 502 may result in a data error if the threshold voltage for the cell has crossed one of the read thresholds 502 so that the cell currently not in the state that it was programmed (or erased) to.

Figure 6:
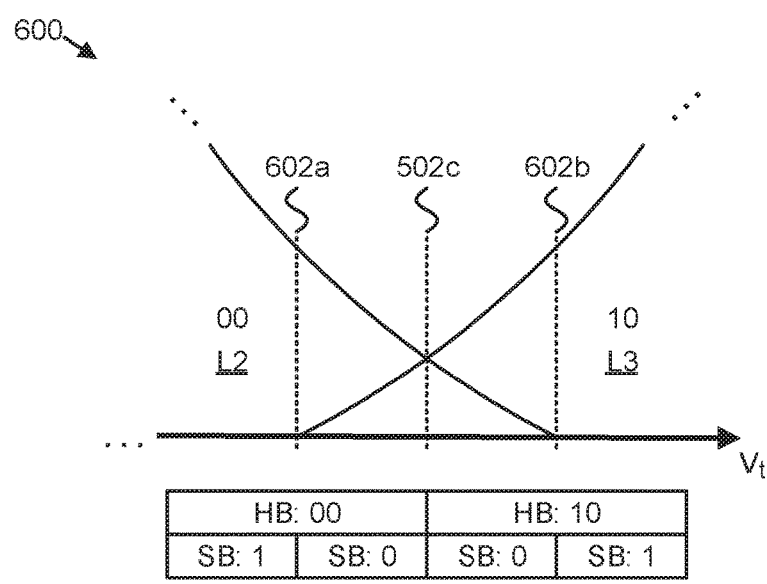
FIG. 6 is a graph illustrating a distribution of threshold voltages near a boundary between states, in one embodiment.

FIG. 6 is a graph 600 illustrating a distribution of threshold voltages near a boundary between states. A dashed rectangle in FIG. 5 indicates the region of the distribution that is depicted in further detail in FIG. 6, at or near the read threshold 502c between the L2 and L3 states. Read thresholds that define states (or boundaries between states), such as the read thresholds 502a-c of FIG. 5, may be referred to as "hard" read thresholds, and information about the cell states in relation to the boundary-defining "hard" read thresholds may be referred to herein as "hard bits."

As described above with reference to FIG. 5, the L0, L1, L2, and L3 states are mapped to the data values "11," "01,"

"00," and "10," respectively. Thus, sensing the cell states in relation to the read thresholds 502a-c may determine or read the hard bits for a cell. In FIG. 6, if a read component 150 determines that the threshold voltage Vt for the cell is above the hard read threshold 502c, then the cell is in the L3 state, and the hard bits "10" have been read. Conversely, if a read component 150 determines that the threshold voltage Vt for the cell is below the hard read threshold 502c (and above the hard read threshold 502b shown in FIG. 5), then the cell is in the L3 state, and the hard bits "00" have been read.

However, due to overlap in the distributions of cells originally programmed to the L2 and L3 states, the hard bits may be in error. Therefore, in the depicted embodiment, a read component 150 uses soft read thresholds 602 are to read soft bits from the cells. In the depicted embodiment, the soft read thresholds 602 are voltages that may be applied as read voltages (as described with reference to FIG. 3) to determine if the threshold voltage Vt of a cell is above or below the applied read voltage. In another embodiment, however, a soft read threshold used to determine soft bits may be a resistance threshold, a current threshold, or the like, depending on the type of hard read threshold that is used to define the states.

In various embodiments, "soft bits" may be any form of information indicating reliability of the hard bits, confidence in the hard bits, or the like. For example, in some embodiments, soft bits may be multiple-bit values such as likelihoods, log-likelihoods, log-likelihood ratios, or the like. In the depicted embodiments, the soft bits are single-bit values where a soft bit value of "1" indicates that hard bits are more reliable, and a soft bit value of "0" indicates that the hard bits are less reliable. In another embodiment, soft bit values may be inverted so that a "0" indicates greater reliability. Error correcting code (ECC) decoders may use redundant information (encoded in the data at write time and read with the hard bits) to detect and correct errors in the data. Some ECC decoders may also use soft bits to aid in determining which of the hard bits are in error. In some embodiments, error correcting code decoders that use soft bits may be capable of detecting and correcting more errors than otherwise-comparable decoders that do not use soft bits to decode data.

In the depicted embodiment, results of sensing whether the threshold voltage Vt for a cell is above or below two soft read thresholds 602a-b may be combined with an inverted exclusive or (NXOR) operation that outputs a 0 if the inputs are different or a 1 if the inputs are the same, to determine the soft bits. For example, if the threshold voltage Vt for a cell is above both of the soft read thresholds 602a-b, or below both of the soft read thresholds 602a-b, then the resulting soft bit is a "1," indicating that the threshold voltage Vt for the cell is not near the hard read threshold 502c, and that the hard bits should be treated as reliable. However, if the threshold is above the first soft read threshold 602a but below the second soft read threshold 602b, then the resulting soft bit is a "0," indicating that the threshold voltage Vt for the cell is near the hard read threshold 502c, and that the hard bits should be treated as less reliable, or as possibly erroneous.

In the depicted embodiment, a read component 150 determines soft bits in relation to two soft read thresholds 602 for one hard read threshold 502. In another embodiment, a read component 150 may determine soft bits in relation to more or fewer than two soft read thresholds 602 per hard read threshold 502. For example, in one embodiment, sensing using four soft read thresholds 602, two on either side of the hard read threshold 502, may provide additional soft bits to indicate different degrees of reliability for the hard bits.

In another embodiment, a read component 150 may determine that errors due to drift in one direction are more likely than errors due to drift in another direction, and may determine soft bits in relation to the hard read threshold 502 and a single soft read threshold 602 in the more likely drift direction from the hard read threshold 502. For example, long retention times with infrequent data access may suggest that cells are more likely to drift to lower-voltage states due to charge leakage than to drift to higher-voltage states, and a read component 150 may use a single soft read threshold 602 at a lower voltage than the hard read threshold 502. Conversely, short retention times with frequent data access may suggest that cells are more likely to drift to high-voltage states due to read disturbs or program disturbs than to drift to lower-voltage states, and a read component 150 may use a single soft read threshold 602 at a higher voltage than the hard read threshold 502. In some embodiments, a read component 150 may determine a number of read thresholds 502, 602 to use for sensing, and a distance of the soft read thresholds 602 from the hard read threshold 502. For example, a read component 150 may determine numbers and locations of read thresholds based on factors such as current temperature, temperature at write time, data retention time, number of program/erase cycles, error rates for reading cells of a region of an array 200, error rates for reading cells of another region of an array 200, or the like.

In certain embodiments, a read component 150 that reads hard bits and soft bits using hard and soft read thresholds 502, 602 may take significantly more time to read data than a read component 150 that reads hard bits using hard read thresholds 502 without soft read thresholds 602. Taking time to repeatedly apply different bias conditions (e.g., read voltages at a word line 310 corresponding to different hard and soft read thresholds 502, 602) and sense the resulting conditions at bit lines 304 may significantly increase the latency of a read operation. However, in a time-based soft bit read mode, a read component 150 may sense resulting conditions at bit lines 304 (or at capacitors coupled to bit lines 304) at multiple times for a single set of applied bias conditions (e.g., without reapplying different bias conditions), and the sense results at different times may be equivalent or comparable to the results of using different bias conditions to read soft bits. In some embodiments, sensing resulting conditions at multiple times for a single set of applied bias conditions may take significantly less time than sensing by iteratively applying different bias conditions.

Figure 7:
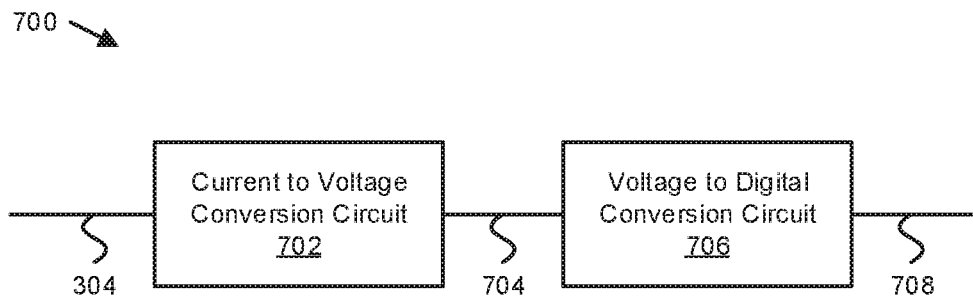
FIG. 7 is a schematic block diagram illustrating one embodiment of a sense amplifier.
Figure 8:
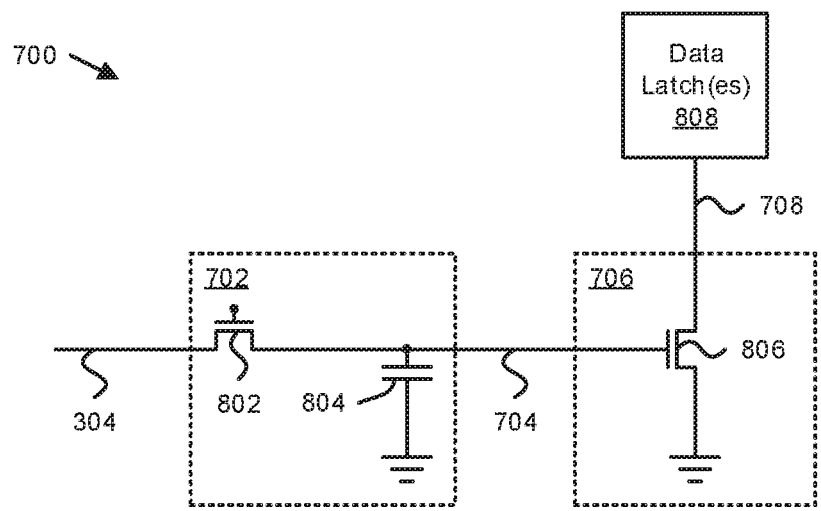
FIG. 8 is a schematic block diagram illustrating another embodiment of a sense amplifier.

FIGS. 7 and 8 depict a sense amplifier 700, in some embodiments. In certain embodiments, as described above, bit line bias/sense circuits 302 may include sense amplifiers 700 coupled to the bit lines 304 of a memory array 200. In various embodiments, sense amplifiers 700 may convert analog electrical properties at the bit lines 304, such as bit line voltages or currents, to digital results such as logic levels or data values.

As depicted in FIG. 7, in one embodiment, a sense amplifier 700 includes a current to voltage conversion circuit 702, and a voltage to digital conversion circuit 706. In various embodiments, a current to voltage conversion circuit 702 may be coupled to a bit line 304, and may produce a voltage in the sense amplifier 700 (e.g., at node 704) based on a bit line current, so that the state of a cell coupled to the bit line 304 affects the sense amplifier analog voltage at node 704.

In various embodiments, a current to voltage conversion circuit 702 may convert bit line currents to analog sense amplifier voltages in various ways. For example, in one embodiment, a current to voltage conversion circuit 702 may use the bit line current to charge or discharge a capacitor, so that the voltage across the capacitor is an analog voltage based on the bit line current. In another embodiment, a current to voltage conversion circuit 702 may use the inherent capacitance of the bit line 304 (e.g., its self-capacitance and/or its parasitic mutual capacitance with nearby components such as other bit lines 304) as a capacitor that produces an analog voltage, without providing a separate or discrete capacitor to charge or discharge. In another embodiment, a current to voltage conversion circuit 702 may convert a bit line current to a voltage by directing the current through a resistor (e.g., to ground or another reference voltage), so that the voltage drop across the resistor depends on the bit line current. In another embodiment, a current to voltage conversion circuit 702 may include a bipolar junction transistor controlled by the input current. Various other or further components capable of producing an analog voltage based on the electrical state of a bit line 304 (which is, in turn, based on the state or data value stored by a cell), may be used in a current to voltage conversion circuit 702.

In the depicted embodiment, the sense amplifier 700 includes a voltage to digital conversion circuit 706 that converts analog voltages to digital sense amplifier results. In the depicted embodiment, the voltage to digital conversion circuit 706 converts an analog voltage at node 704, from the current to voltage conversion circuit 702, to a digital sense amplifier result at an output line 708. The sense amplifier output line 708 may be coupled to circuits that use a digital result, such as latches that store and output a result, an error correcting code decoder, or the like. Circuits that use a digital result may include column circuits 204, a die controller 206, or the like.

The term "digital," as used herein, may refer to any voltage, current, or other signal that is discretized, or confined to a finite number of logic levels representing data. For example, in one embodiment, a high logic level may represent a binary one, while a low logic level represents a binary zero. In another embodiment, four different logic levels may represent four different two-bit data values, eight logic levels may represent eight different three-bit data values, or the like. A logic level may be a value or an allowed band of values for the voltage, current, or other discretized signal. The term "analog," by contrast, may be used herein to refer to any voltage current, or other signal that is not digital, or is not confined to a finite number of logic levels.

In certain embodiments, whether a signal is digital or analog may depend on the existence of defined logic levels. For example, an analog signal may be interpreted as a digital signal by defining logic levels that determine whether the signal represents a 0 or a 1 at any given time. (However, in the absence of a gap between allowed logic levels, such a signal may not be reliable for representing data, because a small amount of noise may change the represented data value). Conversely, a digital signal may resemble an analog signal during transitions between logic levels, or due to noise, voltage drift or the like. However, in certain embodiments, the term "digital" may more specifically refer to voltages, currents, or other signals that are directly usable as logic inputs by electronic components of a device, such as logic gates, latches, or the like of a non-volatile memory element 123. Conversely, the term "analog" may refer to voltages, currents, or other signals that are not directly usable as logic inputs by other electronic components of a device, even if the voltages, currents, or other signals do in some sense represent or correspond to a data value.

In various embodiments, a voltage to digital conversion circuit 706 may digitize an analog sense amplifier voltage by converting the analog voltage to a digital signal referred to herein as a sense amplifier result. Sense amplifier results may include hard bits and/or soft bits as described above. In various embodiments, a voltage to digital conversion circuit 706 may convert analog sense amplifier voltages to digital sense amplifier results in various ways. For example, in one embodiment, the voltage to digital conversion circuit 706 may include a transistor that turns on or off based on a gate-to-source voltage, where the gate (or source) of the transistor is coupled to the voltage at node 704, and where the source (or gate) of the transistor is coupled to a reference voltage, or to ground. In another embodiment, the voltage to digital conversion circuit 706 may include a comparator, and the input terminals of the comparator may be coupled to the voltage at node 704 and a reference voltage. In another embodiment, the voltage to digital conversion circuit 706 may include a pair of inverters connected in a loop, with voltage at node 704 and a reference voltage coupled to opposite sides of the loop so that feedback amplifies the difference between the voltages to digital levels. Various other or further components capable of converting an analog voltage at a sense amplifier 700 to a digital sense amplifier result may be used in a voltage to digital conversion circuit 706.

FIG. 8 depicts a further embodiment of a sense amplifier 700, which may be substantially similar to the sense amplifier 700 described above with reference to FIG. 7, including a current to voltage conversion circuit 702, and a voltage to digital conversion circuit 706, which may be substantially as described above. In the depicted embodiment, the current to voltage conversion circuit 702 includes a capacitor 804. In various embodiments, capacitors 804 associated with cells may be capacitors 804 in sense amplifiers 700, coupled to cells via bit lines 304. Capacitors 804 may be charged or discharged via electrical currents in bit lines 304. For example, in one embodiment, a capacitor 804 may be precharged, or pre-discharged, then coupled to a bit line 304 for a period of time (e.g., while switching transistor 802 is on) to discharge (or charge) the capacitor 804 via the bit line current. After a period of time, the voltage across the capacitor 804 will depend on the extent to which the capacitor 804 was charged or discharged via the bit line current.

Although the current to voltage conversion circuit 702 is depicted as including a capacitor 804 and a switching transistor 802 in the depicted embodiment, another embodiment of a current to voltage conversion circuit 702 may include more or fewer components. For example, in one embodiment, the switching transistor 802 may be omitted so that the capacitor 804 is directly coupled to the bit line 304, and initially precharged by the bit line bias/sense circuits 302. In another embodiment, a discrete capacitor 804 may be omitted and a sense amplifier 700 may use the capacitance of the bit line 304 itself as a source of an analog voltage to be digitized. In another embodiment, a current to voltage conversion circuit 702 may include additional circuits not shown in FIG. 8, such as a capacitor bias circuit that sets an initial bias voltage for the capacitor 804, separate from a circuit that applies bias conditions to a bit line 304.

In the depicted embodiment, the voltage to digital conversion circuit 706 includes a sense transistor 806. The source terminal of the sense transistor 806 is coupled to ground (or another reference voltage, in another embodiment), and the gate terminal of the sense transistor 806 is coupled to the analog voltage produced by the current to voltage conversion circuit 702 at node 704. The sense transistor 806 produces a digital sense amplifier result at the output line 708, which is stored in one or more data latches 808. Data latches 808 may store hard bits and soft bits for output, or for use by other components such as an error correcting code decoder.

In the depicted embodiment, the output line 708 may be precharged (via circuitry not shown in FIG. 8). If the voltage at node 704 is not sufficient to turn the sense transistor 806 on, then the output line 708 remains high, and the digital sense amplifier result recorded by the data latches 808 is a binary "1." (Latches 808 may be gated, edge triggered, or the like, to latch in the result from the output line 708 at a particular time). If the voltage at node 704 is sufficient to turn the sense transistor 806 on, then the output line 708 is pulled low, and the and the digital sense amplifier result recorded by the data latches 808 is a binary "0."

In the depicted embodiment, the sense transistor 806 is an NMOS transistor that turns on if the voltage at node 704 is high. In another embodiment, a sense transistor 806 may be a PMOS transistor that turns off if the voltage at the node 704 is high. In various embodiments, a sense transistor 806 may be an n-channel transistor, a p-channel transistor, an enhancement mode transistor, a depletion mode transistor, a junction field effect (JFET) transistor, or any other transistor or switching element that switches on or off based on an applied voltage. Similarly, an output line 708 may be initially high, and pulled low if the sense transistor 806 switches on or off, or may be initially low and pulled high if the sense transistor 806 switches on or off.

Although the voltage to digital conversion circuit 706 includes a sense transistor 806 in the depicted embodiment, a voltage to digital conversion circuit 706 in another embodiment may include different components for sensing analog capacitor voltages and producing a digital sense amplifier result. For example, a voltage to digital conversion circuit 706 may include a comparator, a latch, a tri-state buffer, or another component capable of outputting a digital result.

Figure 9:
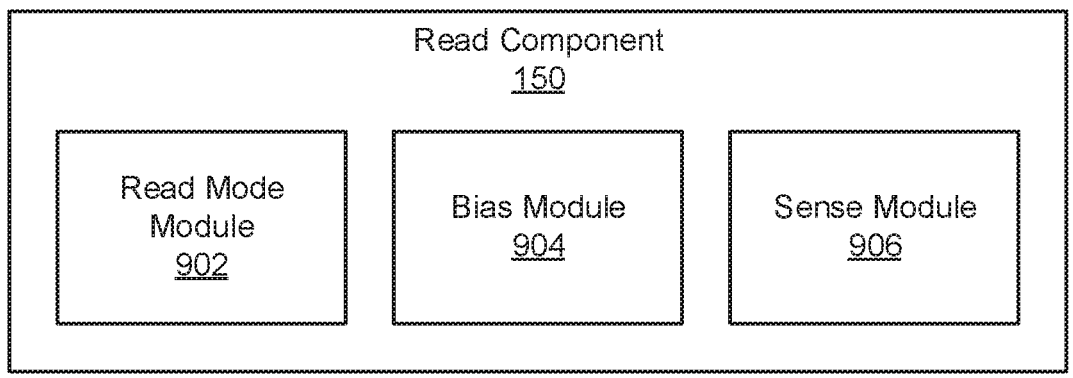
FIG. 9 is a schematic block diagram illustrating one embodiment of a read component.

FIG. 9 depicts one embodiment of a read component 150. In various embodiments, a read component 150 may be substantially as described above with reference to FIGS. 1-8, and may include or communicate with bias circuits 302, 308, 314, a sense amplifier 700, or the like. In the depicted embodiment, the read component 150 includes a read mode module 902, a bias module 904, and a sense module 906, which are described below.

In general, in various embodiments, the read component 150 may select between a plurality of read modes for reading data from a non-volatile memory array, and may implement or control a read operation using the selected read mode. Different read modes may reflect different tradeoffs between reliability and speed, and may differ as to aspects such as whether soft bits are obtained, how many soft bits are obtained for each hard bit, how the soft bits are obtained or the like. Providing multiple read modes may allow a read component 150 to avoid high-latency read times or high error rates by selecting a read mode based on conditions such as time since writing data, temperature difference since writing data, or the like.

The read mode module 902, in the depicted embodiment, is configured to select a read mode from a plurality of read modes for reading data from a region of the non-volatile memory array 200. A read mode, in various embodiments, may refer to a way or manner of reading data from memory cells. For example, a read component 150 that selects or uses a first read mode may perform a certain series of steps to read data from memory cells, but may perform a different series of steps to read data from memory cells if it selects or uses a second read mode. In some embodiments, selecting a read mode may include determining whether to use a time-based soft bit read mode for reading data from a region of non-volatile memory, or whether to use another read mode.

The read component 150 may use a read mode selected or determined by the read mode module 902 to perform a read operation that reads data from a region of a non-volatile memory array 200. A region from which data is read in a read operation may be based on the granularity of a read operation. For example, a region from which data is read may be eight cells for a byte level read operation, or may be cells of a row or layer of an array for a page or block-level read operation.

In the depicted embodiment, the plurality of read modes (e.g., possible read modes), from which the read mode module 902 selects a read mode for reading data, includes at least a time-based soft bit read mode. In various embodiments, a time-based soft bit read mode may be a mode in which a read component 150 performs a read operation performed by applying a single set of bias conditions to a region of cells, and sensing resulting conditions (e.g., bit line currents, capacitor voltages, or the like), at multiple times. For example, a read operation in a time-based soft bit read mode may include repeatedly digitizing capacitor voltages (or other analog sense amplifier voltages) to read both hard bits and soft bits. In further embodiments, a time-based read mode may involve reading soft bits without reapplying a new set of bias conditions to the region of cells.

For example, as described above, a sense amplifier 700 may output a digital result based on whether a voltage at a capacitor 804 satisfies (or fails to satisfy) a threshold for turning a sense transistor 806 on (or off). The voltage at the capacitor 804 may integrate or sum up a bit line current over time, where the bit line current depends on bias conditions applied to a cell and on the state of the cell. If the bias conditions result in a high bit line current from a transistor-based cell 306 being turned on, or from a resistor-based cell 406 being in a low-resistance state, then the capacitor 804 may be charged or discharged quickly by the bit line current. Conversely, if the bias conditions result in a low or zero bit line current from a transistor-based cell 306 being turned off, or from a resistor-based cell 406 being in a high-resistance state, then the capacitor 804 may be charged or discharged more slowly or not at all by the bit line current. Thus, sensing or digitizing the capacitor voltage after a certain time period may identify whether the capacitor 804 is charged or discharged, thus distinguishing between high bit line currents and low bit line currents, and between different states of a cell corresponding to the different bit line currents.

Sensing or digitizing the capacitor voltage at multiple time points may produce soft bits that correspond to soft read thresholds 602 as described above with reference to FIG. 6, without reapplying different bias conditions for different read thresholds 502, 602. With a single set of bias conditions applied, a bit line current that is sufficient to charge or discharge a capacitor 804 past a threshold for switching a sense transistor 806, at a nominal integration time for reading the hard bits, may be either a high bit line current that speedily charges or discharges the capacitor 804 past the threshold, or may be an intermediate bit line current that slowly charges or discharges the capacitor 804 past the threshold. Similarly, if the bit line current is insufficient to charge or discharge the capacitor 804 past the threshold at the nominal integration time for reading hard bits, the bit line current may be a low bit line current, or may be an intermediate bit line current that would have charged or discharged the capacitor 804 past the threshold after a slightly longer period of time. Sensing the capacitor voltage (e.g., digitizing the analog capacitor voltage by determining if a sense transistor 806 has switched, or by using another type of voltage to digital conversion circuit 706) at one or more additional integration times prior to and/or subsequent to the nominal integration time, may allow a read component 150 to distinguish between higher, lower, and intermediate bit line currents, to obtain a result equivalent to applying higher and lower read voltages to the control gate of a cell as bias conditions. Read operations for a time-based soft bit read mode are described in further detail below with reference to the bias module 904 and the sense module 906.

In various embodiments a read mode module 902 selects a read mode from a plurality of read modes that includes at least a time-based soft bit read mode. A plurality of read modes, in further embodiments, includes at least one other read mode in addition to the time-based soft bit read mode. For example, in various embodiments, a plurality of read modes may include a hard bit read mode, in which the read component 150 reads hard bits without soft bits, and/or a bias-based soft bit read mode in which the read component 150 reads hard bits and soft bits by iteratively applying different bias conditions and sensing the resulting capacitor voltages. In some embodiments, a plurality of read modes may include more than one time-based soft bit read mode, where the different time-based soft bit read modes define different parameters for sensing results at multiple integration times. For example, read operations in different time-based soft bit read modes may include different numbers of integration times, different spacings between integration times, or the like. Similarly, in some embodiments, a plurality of read modes may include more than one bias-based soft bit read mode defining different parameters such as a number of soft read thresholds 602, spacings between soft read thresholds 602, or the like. Various other or further read modes may be defined for performing read operations and included in a plurality of read modes from which the read mode module 902 selects a read mode.

In various embodiments, a read mode module 902 may select a read mode from a plurality of read modes in various ways. For example, selection of a read mode may be based on an error rate, a data retention time, a number of program/erase cycles, a current temperature or the like. In general, in various embodiments, a time-based soft bit read mode may have intermediate latency and reliability, compared to a low-latency, low-reliability hard bit read mode (in which errors are more likely to be uncorrectable due to the absence of soft bits), or to a high-latency, high-reliability bias-based soft bit read mode.

In fact, due to the high latency associated with iteratively applying different bias conditions, some die controllers 206 may read data using a bias-based soft bit read mode as an exceptional case, for handling read errors that were not correctable when data was read in a lower-latency read mode (e.g., a hard bit read mode). However, due to lower latency of a time-based soft bit read mode, a controller such as a device controller 126 or a die controller 206 may use the time-based soft bit read mode as a default read mode in some embodiments. With the time-based soft bit read mode as a default read mode, a controller may perform read operations as defined by the time-based soft bit read mode as a default or standard type of read operation, and may use other read modes in response to specific conditions such as an explicit command to perform an operation in another read mode, a high error rate, or the like. In various embodiments, the use of a time-based soft bit read mode as a default read mode may provide smooth read performance due to a decoder having consistent access to soft bits without the high-latency error handling of rereading in a bias-based soft bit read mode if a hard bit read has uncorrectable errors.

In some embodiments, the read mode module 902 may select a read mode from a plurality of read modes based on information included in a read command received by a controller such as a device controller 126 or a die controller 206. Information included in a read command may include the read command itself, and/or any parameters of the read command. For example, in one embodiment, a command set for a non-volatile memory element 123 may include different read commands for different read modes, allowing the read mode to be specified by a user, an application, an operating system, a device driver, a device controller 126, or the like, and the read mode module 902 may select a read mode according to the read mode specified by a read command. In another embodiment, different parameters for a read command may specify different read modes, and the read mode module 902 may select a read mode based on the value of a parameter for a read command, the presence or absence of a parameter for a read command or the like. Various other or further types of information that may be included in a read command may be similarly used by the read mode module 902 to select a read mode.

In some embodiments, the read mode module 902 may select a read mode for reading data from a region of a memory array 200 based on factors such as metadata for the region, error correction information for the region, metadata or error correction information for another region of the memory array 200, or the like. Further ways for a read mode module 902 to select a read mode are described in further detail below with reference to the metadata module 1010, the error correction module 1012, and the current conditions module 1014 of FIG. 10.

The bias module 904, in the depicted embodiment, is configured to apply a set of bias conditions to cells of a region of a memory array 200. In various embodiments, when data is being read from a region of an array 200 such as cells of a byte, page or block, the read mode module 902 may select a read mode for the region, and the bias module 904 may apply bias conditions to the region. In some embodiments, a bias module 904 applying bias conditions to cells in a region from which data is being read may apply further bias conditions to cells outside the region. For example, for reading data from cells in a row of a NAND flash memory array, the bias module 904 may apply a read bias voltage to cells in the row via a word line 310, and may apply a high control gate voltage to cells of other rows.

As described above with reference to FIGS. 3 and 4, bias conditions applied to cells may be electrical conditions such as bias voltages, bias currents, or the like, and may be conditions that are maintained in a steady state for a period of time during a read operation (e.g., control gate voltages for reading from flash memory cells) or may be transient conditions that are permitted to vary from an initially applied value (e.g., bit line precharge voltages). In some embodiments, applying bias conditions to cells may include applying precharge or bias voltages (or other electrical conditions) to peripheral components coupled to the cells, such as by precharging a capacitor 804 of a sense amplifier 700. In various embodiments, bias conditions may be any set of voltages, currents, or other conditions that, when applied to cells in a region of a memory array 200, result in some other condition such as a bit line current or a capacitor voltage that depends on the state of one or more cells.

The bias module 904, in various embodiments, may apply bias conditions to cells using circuits such as bit line bias/sense circuits 302, word line bias circuits 308, and/or source bias circuits 314, coupled to the cells via bit lines 304, word lines 310, and/or source lines 312. In various embodiments, the bias module 904 may include or communicate with one or more bias circuits 302, 308, 314.

In various embodiments, a bias module 904 may apply bias conditions to cells of a region of an array 200 so that bit line currents associated with the cells of the region affect voltages at capacitors associated with the cells of the region. Bit line currents associated with the cells, in various embodiments, may be electrical currents in bit lines 304 coupled to the cells. In various embodiments, a current may be a positive current (e.g., in a direction defined as positive), a negative current (e.g., in an opposite direction to the direction defined as positive), or a zero current. The term "current" may be used herein to refer to a rate of flow of electric charge regardless of whether the rate is zero or nonzero.

In various embodiments, capacitors associated with the cells may be electrical components with a capacitance coupled to the cells, or to the bit lines 304. In one embodiment, capacitors associated with cells may be sense amplifier capacitors 804 as described above. In another embodiment, capacitors associated with cells may be the bit lines 304 themselves, including their capacitance relative to nearby components. A bit line current may affect a voltage at an associated capacitor by charging the capacitor, discharging the capacitor, or leaving the capacitor voltage unchanged (in the case of a zero current). Thus, just as bit line currents in various embodiments may be positive, negative or zero, capacitor voltages affected by bit line currents may be increased, decreased, or left unchanged by the bit line currents. Even if a capacitor voltage is unchanged due to a zero bit line current in a bit line 304 coupled to a capacitor 804, the capacitor voltage may be said to be "affected" by the bit line current because it is a result of the bit line current in the sense that a different bit line current would have produced a different capacitor voltage.

As described above with reference to FIGS. 7 and 8, in some embodiments, a sense amplifier 700 may convert a bit line current to an analog sense amplifier voltage in various ways, using various types of current to voltage conversion circuit 702. In various embodiments, bias voltages or other bias conditions applied by the bias module 904 may affect analog voltages at sense amplifiers 700 associated with a cell. Analog voltages at sense amplifiers 700 associated with cells may include voltages produced by a current to voltage conversion circuit 702 coupled to a bit line 304. Sense amplifiers 700 associated with cells may include sense amplifiers 700 coupled to cells, such as sense amplifiers 700 in bit line bias/sense circuits 302, coupled to cells via bit lines 304.

As described above with reference to capacitor voltages, analog sense amplifier voltages may be affected by bias conditions or bit line currents if the analog voltages result from the bias conditions or bit line currents, regardless of whether the resulting voltage is increased, decreased, or left unchanged in a particular set of circumstances such as zero bit line current, where the resulting voltage would have been changed in response to a different set of bias conditions or a different bit line current.

The sense module 906, in the depicted embodiment, is configured to sense capacitor voltages resulting from a set of bias conditions applied by the bias module 904. In response to the read mode module 902 selecting the time-based soft bit read mode, the sense module 906 is configured to sense capacitor voltages at multiple integration times. A sense module 906 may include or communicate with various components for sensing capacitor voltages, converting analog voltages at sense amplifiers 700 to digital sense amplifier results, or digitizing sense amplifier results, such as a sense transistor 806, a voltage to digital conversion circuit 706, a sense amplifier 700, and/or bit line bias/sense circuits 302.

In the depicted embodiment, in response to the read mode module 902 selecting the time-based soft bit read mode for reading data from a region of a memory array, the sense module 906 is configured to read hard bits and soft bits for the region by sensing capacitor voltages or otherwise converting analog voltages to a digital result at multiple integration times. As described above, hard bits may be data values read from the cells, which may be data values stored by the cells, but subject to errors that may have occurred while writing, retaining, or reading the data, while soft bits may be information indicating reliability of the hard bits, confidence in the hard bits, error probabilities for the hard bits, or the like. A sense module 906 may read hard bits and soft bits by determining the hard bits and soft bits based on capacitor voltages or other analog conditions that correspond to cell states.

The term "integration time," in various embodiments, may refer to times at which capacitor voltages or other analog sense amplifier voltages are sensed or digitized. In some embodiments, an integration time may refer specifically to a time period during which a capacitor 804 integrates or sums up an electrical current, so that the resulting amount of charge at the capacitor 804 produces a capacitor voltage. In such an embodiment, an integration time may begin when a bit line current is coupled to a capacitor 804 (e.g., via a switching transistor 802) and may end when the capacitor voltage is digitized or sensed. In another embodiment, an integration time may refer more broadly to a time period during which bias conditions produce analog sense amplifier voltages based on data values stored by memory cells. The term integration time may be used interchangeably to refer to durations that end when analog voltages are digitized or sensed, or to point in time when analog voltages are digitized or sensed.

When referring to durations, multiple integration times may be overlapping durations that begin at a common point in time relative to the bias module 904 applying bias conditions, and that end at different points in time for sensing or digitizing capacitor voltages or other sense amplifier analog voltages. When referring to points in time, multiple integration times may be different points in time for sensing or digitizing the analog sense amplifier voltages resulting from a single applied set of bias conditions.

The term "multiple integration times" is used herein to refer to sensing or digitizing analog sense amplifier voltages resulting from a single application of bias conditions to cells, at multiple times when the analog sense amplifier voltage is based on that application of bias conditions to the cells. For example, bias conditions may be applied to cells so that a capacitor voltage develops over time based on the bias conditions and on the data values stored by the cells, and sensing at multiple integration times may include repeatedly sensing or digitizing the capacitor voltage at multiple points in time as it charges or discharges in response to the initially applied bias conditions.

The term "multiple integration times" is not used herein to refer to times that are separated by the bias module 904 applying a different set of bias conditions. For example, in a bias-based soft bit read mode, a controller may iteratively apply different bias conditions and convert resulting analog sense amplifier voltages to digital sense amplifier results. Although multiple iterations of the bias, integrate, and sense process might each include sensing a capacitor voltage at an integration time, the integration times that are separated by applying different bias conditions are not referred to as multiple integration times. Rather, a sense module 906 sensing at multiple integration times, in various embodiments, senses capacitor voltages (or other analog sense amplifier voltages) at multiple times in response to a single application of bias conditions by the bias module 904, without the bias module 904 reapplying different bias conditions.

In various embodiments, sensing capacitor voltages or other analog voltages may include using a voltage to digital conversion circuit 706 to produce a digital sense amplifier result, and/or receiving or storing the digital sense amplifier result (e.g., in data latches 808). Thus, to sense capacitor voltages at multiple integration times, a sense module 906 may control timing of sense amplifier components. For example, referring to FIG. 8, the capacitor 804 is directly coupled to the gate terminal of the sense transistor 806, and the sense transistor 806 may turn on at any time when the capacitor voltage exceeds the threshold voltage for the sense transistor 806. Thus, to sense the capacitor voltage at multiple integration times, the sense module 906 may control or trigger data latches 808 so that the result at output line 708 is latched into different data latches 808 at different integration times. In another embodiment, a sense module 906 may control a switching component such as a transistor that couples or decouples the capacitor 804 (or the analog voltage at node 704) to the sense transistor 806 (or other voltage to digital conversion circuit 706), and may sense the analog voltage at multiple integration times by coupling the analog voltage to the sense transistor 806 at those integration times. Various other or further components of a sense amplifier 700 may similarly be controlled by a sense module 906 to sense or digitize capacitor voltages at multiple integration times.

In some embodiments, a sense module 906 may read or determine hard bits and soft bits based on the digital sense amplifier results from multiple integration times. In one embodiment, hard bits may be bits read by a sense module 906 at one of the multiple integration times, an soft bits may be calculated by the sense module 906 based on the extent to which the bits from the other integration times agree or disagree with the hard bit result. In another embodiment, hard bits may be a "consensus" or majority result from multiple integration times, and soft bits may indicate a ratio or other measurement of how many of the integration times produced a result that differs from the hard bits. Various other or further ways of combining digital sense amplifier results from multiple integration times may be used by a sense module 906 to determine hard bits and soft bits.

Figure 10:
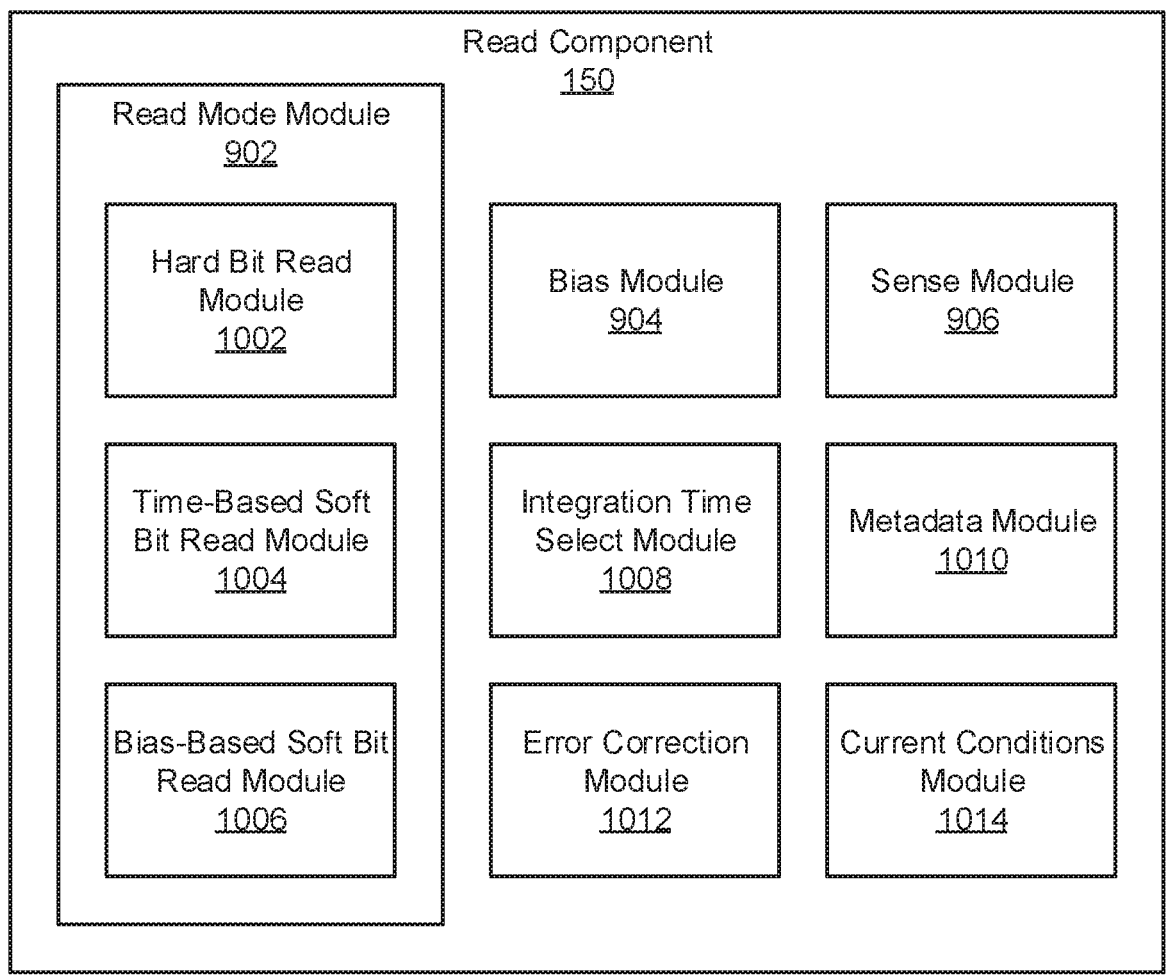
FIG. 10 is a schematic block diagram illustrating another embodiment of a read component.

FIG. 10 depicts another embodiment of a read component 150. In the depicted embodiment, the read component 150 may be substantially similar to the read components 150 described above with reference to FIGS. 1-9, including a read mode module 902, a bias module 904, and a sense module 906. In the depicted embodiment, the read mode module 902 includes a hard bit read module 1002, a time-based soft bit read module 1004, and a bias-based soft bit read module 1006. In the depicted embodiment, the read component 150 includes an integration time select module 1008, a metadata module 1010, an error correction module 1012, and a current conditions module 1014.

In the depicted embodiment, the plurality of read modes that may be selected by the read mode module 902 include a time-based soft bit read mode, as described above, as well as a hard bit read mode and a bias-based soft-bit read mode. In response to the read mode module 902 selecting the time-based soft bit read mode, the time-based soft bit read module 1004 may communicate with the bias module 904 and the sense module 906 to perform a time-based soft bit read as described above, including sensing or digitizing capacitor voltages resulting from an applied set of bias conditions, at multiple integration times.

The hard bit read module 1002, in the depicted embodiment, is configured to communicate with the bias module 904 and the sense module 906 to perform a hard bit read, in response to the read mode module 902 selecting a hard bit read mode from the plurality of read modes. In the hard bit read mode, the sense module 906 may read hard bits for a region of memory cells by sensing the capacitor voltages (or other analog sense amplifier voltages) resulting from a set of bias conditions applied by the bias module 904 at a single integration time. In a hard bit read mode, sensing at a single integration time may not provide enough information to read or determine soft bits, but may provide hard bits with lower latency than in a soft bit read mode. In some embodiments, a read mode module 902 may select a hard bit read mode if an error rate is expected to be low (e.g., at or below a rate correctable by an error correcting code decoder without using soft bits), such as when data retention time is less than a threshold value, program/erase counts are less than a threshold value, error rates are low for reading data for other regions of the array 200, or the like.

The bias-based soft bit read module 1006, in the depicted embodiment, is configured to communicate with the bias module 904 and the sense module 906 to perform a bias-based soft bit read, in response to the read mode module 902 selecting a bias-based soft bit read mode from the plurality of read modes. In the bias-based soft bit read mode, the bias module 904 and the sense module 906 may cooperate to iteratively apply different bias conditions and sense resulting capacitor voltages. The bias module 904 may apply a set of bias conditions, and the sense module 906 may sense or digitize the capacitor voltages (or other analog sense amplifier voltages) resulting from the applied set of bias conditions, as described above. The bias module 904 may then apply one or more additional sets of bias conditions (in different bias/sense iterations for each set of bias conditions), and the sense module 906 may sense or digitize the capacitor voltages (or other analog sense amplifier voltages) resulting from the additional applied set of bias conditions. The sense module 906 may combine multiple results from the different sets of bias conditions in similar ways to those described above for combining digital sense amplifier results from multiple integration times, to read or determine hard bits and soft bits for a region of memory cells.

In various embodiments, a bias-based soft bit read using results from multiple sets of applied bias conditions may have higher latency than a time-based soft bit read, due to the repeated applications of bias conditions. In some embodiments, however, a bias-based soft bit read may provide greater reliability or better error correction than the time-based soft bit read mode. Thus, in some embodiments, a read mode module 902 may select a high-latency, high-reliability bias-based soft bit read mode if an error rate is expected to be high (e.g., above a rate correctable by an error correcting code decoder using soft bits from a time-based soft bit read), such as when data retention time is above a threshold value, program/erase counts are above a threshold value, error rates are high for reading data for other regions of the array 200, or the like.

In some embodiments, the time-based soft bit read module 1004 may provide multiple time-based soft bit read modes, with different integration times, different numbers of integration times, or the like. In one embodiment, the read mode module 902 may select from a plurality of read modes including a first time-based soft bit read mode and a second time-based soft bit read mode. In the first time-based soft bit read mode, the time-based soft bit read module 1004 may communicate with the sense module 906 to sense or digitize capacitor voltages at two integration times. In the second time-based soft bit read mode, the time-based soft bit read module 1004 may communicate with the sense module 906 to sense or digitize capacitor voltages at three integration times. The different time-based soft bit read modes may reflect different tradeoffs between reliability (from sampling at more integration times) and speed (from sampling at fewer integration times.

The metadata module 1010, in various embodiments, may record metadata for regions of a non-volatile memory array 200 (e.g., bytes, pages, blocks, or the like) at write time, and/or may retrieve metadata at read time. In certain embodiments, the likelihood of data errors may depend on factors such as time and temperature. If data is read after a long retention time, or at a temperature significantly different from when the data was written, errors may be more likely than when data is read after a short retention time, or at a temperature similar to when the data was written. Thus, in some embodiments, the metadata module 1010 may record time and temperature metadata for a region of memory cells at write time. In various embodiments, a metadata module 1010 may store and retrieve various other or further types of metadata for various regions, such as program/erase cycle counts, error rates for prior read operations, or the like.

Time metadata may include any information recording or corresponding to a write time such as a date stamp, an elapsed time since a predefined epoch, a counter value for a periodically incremented counter, or the like. Similarly, temperature metadata may include any information recording a temperature at write time, such as a Celsius temperature, a Fahrenheit temperature, an indication of whether a temperature was high or low relative to a predefined threshold, or the like.

The current conditions module 1014, in certain embodiments may determine current conditions for values that are recorded by the metadata module 1010, such as a current time, and/or a current temperature. The current conditions module 1014, in some embodiments, may include or communicate with circuits for determining current time or temperature conditions, such as clock circuits, counters, thermocouples, thermistors, or the like. At write time, the metadata module 1010 may record metadata based on current conditions from the current conditions module 1014. At read time, the read mode module 902 in some embodiments may select a read mode based on metadata from the metadata module 1010 and/or based on current conditions from the current conditions module 1014.

In one embodiment, the read mode module 902 may select a read mode for reading data from a region of a memory array 200 based on metadata recorded by the metadata module 1010 at write time for the region. For example, in one embodiment, the read mode module 902 may select between a hard bit read mode, a time-based soft bit read mode, and/or a bias-based soft bit read mode based on metadata such as a time/temperature tag indicating a time and temperature at write time for a region, a program/erase cycle count, or the like.

In some embodiments, the read mode module 902 may select a read mode for reading data from a region of a memory array 200 based on a comparison of the current time and temperature, obtained from the current conditions module 1014, to time and temperature metadata recorded at write time for the region, obtained from the metadata module 1010. For example, the read mode module 902 may select between lower-latency, lower, reliability read modes and higher-latency, higher-reliability read modes based on time difference between write time and read time and/or a temperature different between write time and read time.

The error correction module 1012, in the depicted embodiment, is configured to use hard bits and/or soft bits from the sense module 906 to detect and correct data errors. In various embodiments, an error correction module 1012 may include or communicate with one or more error correcting code decoders, such as a hard-decision decoder that uses hard bits without soft bits, and/or a soft-decision decoder that uses hard bits and soft bits to detect and correct errors. In certain embodiments, the error correction module 1012 may provide error correction information to the read mode module 902. Error correction information may include information about raw error rates, correctable error rates, uncorrectable error rates, or the like.

In some embodiments, the read mode module 902 may select a read mode for reading data from a region of a memory array based on error correction information for a region, obtained from the error correction module 1012. For example, if a previous read operation for the region resulted in uncorrectable errors, or in significant error correction latency for decoding data with a large number of correctable errors (e.g., relative to a predefined threshold), the read mode module 902 may switch to a higher-latency, higher-reliability read mode for reading data from that region. Conversely, if a previous read operation for the region resulted in a smaller number of correctable errors relative to a predefined threshold, the read mode module 902 may switch to a lower-latency, lower-reliability read mode for reading data from that region.

In some embodiments, the read mode module 902 may select a read mode for reading data from one region of a memory array 200 based on error correction information and/or metadata for one or more other region of the array 200. In one embodiment, a read mode module 902 may identify or determine groups of regions (e.g., bytes, pages, blocks, or the like) with similar metadata. For example, where the metadata module 1010 records time and temperature metadata at write-time for regions of an array, a read mode module 902 may use time-based thresholds to define groups of regions that were written to at similar times, and/or may use temperature-based thresholds to define groups of regions that were written to at similar temperatures. In a further embodiment, a group of regions may include regions for which both the data retention time and the write-time temperature are similar (e.g., within thresholds). Thresholds for defining groups may be predefined by a manufacturer, dynamically defined based on error rates for different data retention times or temperatures, or the like.

In some embodiments, the read mode module 902 selecting a read mode for a first region based on error correction information and/or metadata for a second region may include selecting a read mode for a group of regions defined based on metadata, with the group of regions including the first region and the second region. In a further embodiment, the read mode for the group of regions (and thus for reading data from the first region) may be based on error correction information generated by the error correction module 1012 when decoding data from the second region. For example, if a read operation for the second region resulted in uncorrectable errors, or in significant error correction latency for decoding data with a large number of correctable errors (e.g., relative to a predefined threshold), the read mode module 902 may switch to a higher-latency, higher-reliability read mode for reading data from regions in the group. Conversely, if a read operation for the second region resulted in a smaller number of correctable errors relative to a predefined threshold, the read mode module 902 may switch to a lower-latency, lower-reliability read mode for reading data from regions in the group.

The integration time select module 1008, in the depicted embodiment, is configured to select integration times used by the sense module 906 for sensing at multiple integration times. In some embodiments, the multiple integration times used by the sense module 906 in the time-based soft bit read mode may include a set of integration times selected by the integration time select module 1008. A set of integration times, in various embodiments, may include integration times defined in various ways, such as numbers of microseconds or nanoseconds since a start time, numbers of clock pulses since a start time, differences from a nominal integration time or a hard bit integration time, or the like. Various other or further ways of indicating a time for sensing or digitizing capacitor voltages (or other analog sense amplifier voltages) may be used by an integration time select module 1008 to define or select a set of integration times for use by the sense module 906.

In one embodiment, the integration time select module 1008 may select integration times based on information included in a read command. For example, a read command itself, or parameters of a read command may indicate integration times directly, or may indicate other information that an integration time select module 1008 uses to select integration times. In another embodiment, the integration time select module 1008 may select integration times for reading data from a region of an array 200 based on metadata for the region, error correction information for the region, error correction information for a second region or group of regions of the non-volatile memory array, and/or metadata recorded at write time for the second region or group of regions. Factors described above that may be used by the read mode module 902 for selecting a read mode may similarly be used by the integration time select module 1008 for selecting integration times.

For example, in one embodiment, the integration time select module 1008 may select an average, central, or nominal integration time for reading hard bits from a region of cells based on information such as a temperature difference since write time, a data retention time, a program/erase cycle count, or the like. In some embodiments, the integration time select module 1008 may select an average, central, or nominal integration time for reading hard bits based on a likely direction or amount of drift in the data-storing physical property of a cell. For example, the integration time select module 1008 may select a hard bit integration time equivalent to a lower hard read threshold 502 if data retention time exceeds a threshold (suggesting that charge leakage is likely), or may select a hard bit integration time equivalent to a higher hard read threshold 502 if a count of operations for other regions exceeds a threshold (suggesting that read disturb or program disturb errors are likely).

In a further embodiment, the integration time select module 1008 may select a number of soft bit integration times (e.g., integration times for reading soft bits, in addition to a central or nominal integration time for reading hard bits), and/or may select one or more time differences between soft bit integration times and the hard bit integration time. For example, referring to FIGS. 5 and 6, where errors are associated with widening and overlapping of the peaks that represent distributions of threshold voltages for cells in different states, the integration time select module 1008 may select soft bit integration times that are closer to a hard bit integration time if a small amount of widening and overlap is likely, or may select soft bit integration times that are further from a hard bit integration time if a larger amount of widening and overlap is likely. In another embodiment, the integration time select module 1008 may increase the number of soft bit integration times if a larger amount of widening and overlap is likely. Thus, in some embodiments, the integration time select module 1008 may select a number of soft bit integration times and/or time differences between soft bit integration times and the hard bit integration time based on one or more factors associated with errors, such as a data retention time, a temperature shift, a read count, a program/erase cycle count, or the like.

Figure 11:
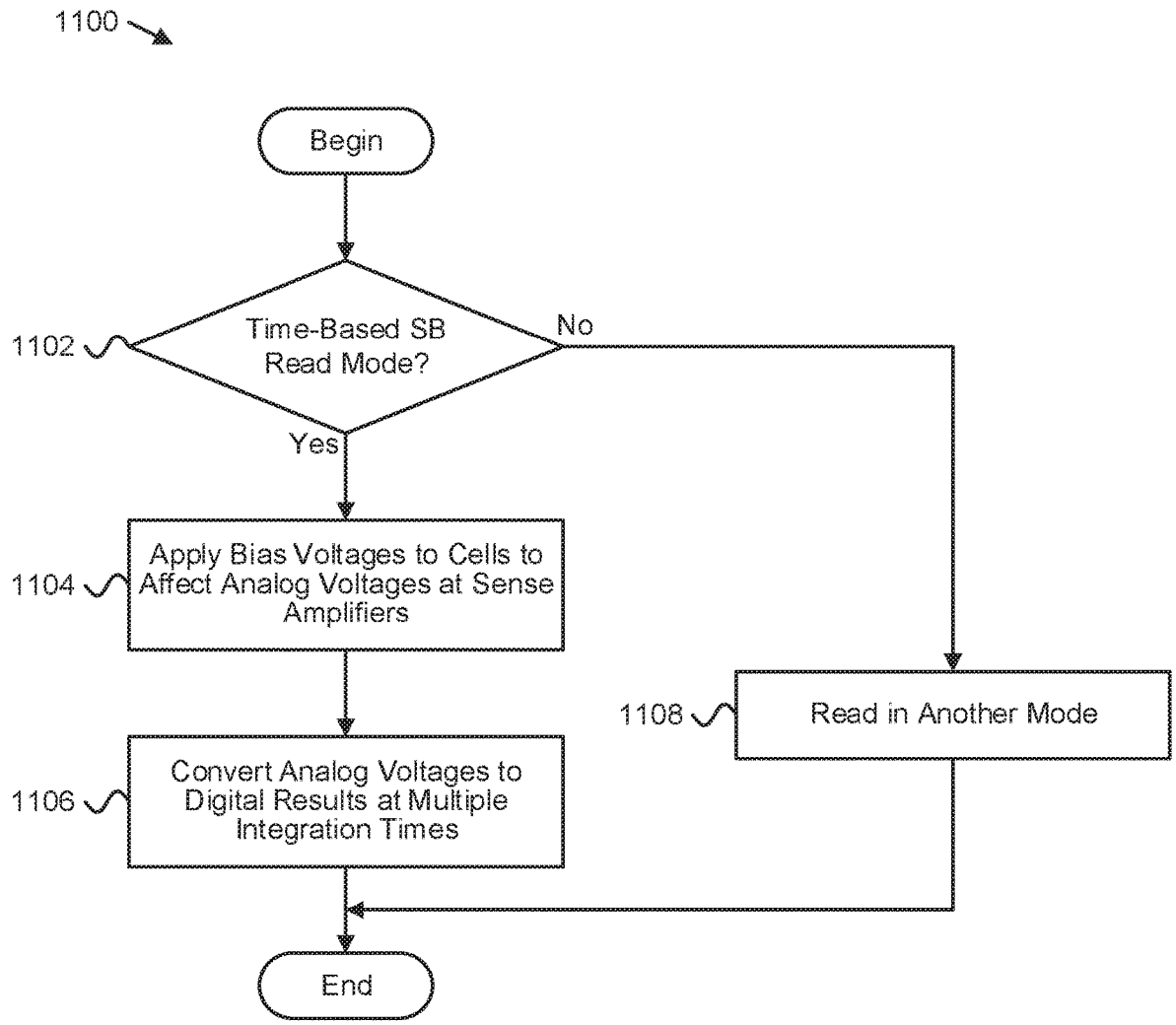
FIG. 11 is a flow chart illustrating one embodiment of a method for reading data.

FIG. 11 is a flow chart illustrating one embodiment of a method 1100 for reading data. The method 1100 begins, and a read mode module 902 determines 1102 whether to use a time-based soft bit read mode for reading data from a region of non-volatile memory. In response to the read mode module 902 determining 1102 not to use a time-based soft bit read mode, a read component 150 reads 1108 data from the region in another read mode, and the method 1100 ends.

In response to the read mode module 902 determining 1102 to use a time-based soft bit read mode, a bias module 904 applies 1104 a set of bias voltages to cells of the region so that states of the cells affect analog voltages at sense amplifiers 700 associated with the cells. A sense module 906 reads hard bits and soft bits for the region by converting 1106 the analog voltages affected by the applied bias voltages to digital sense amplifier results, at multiple integration times, and the method 1100 ends.

Figure 12:
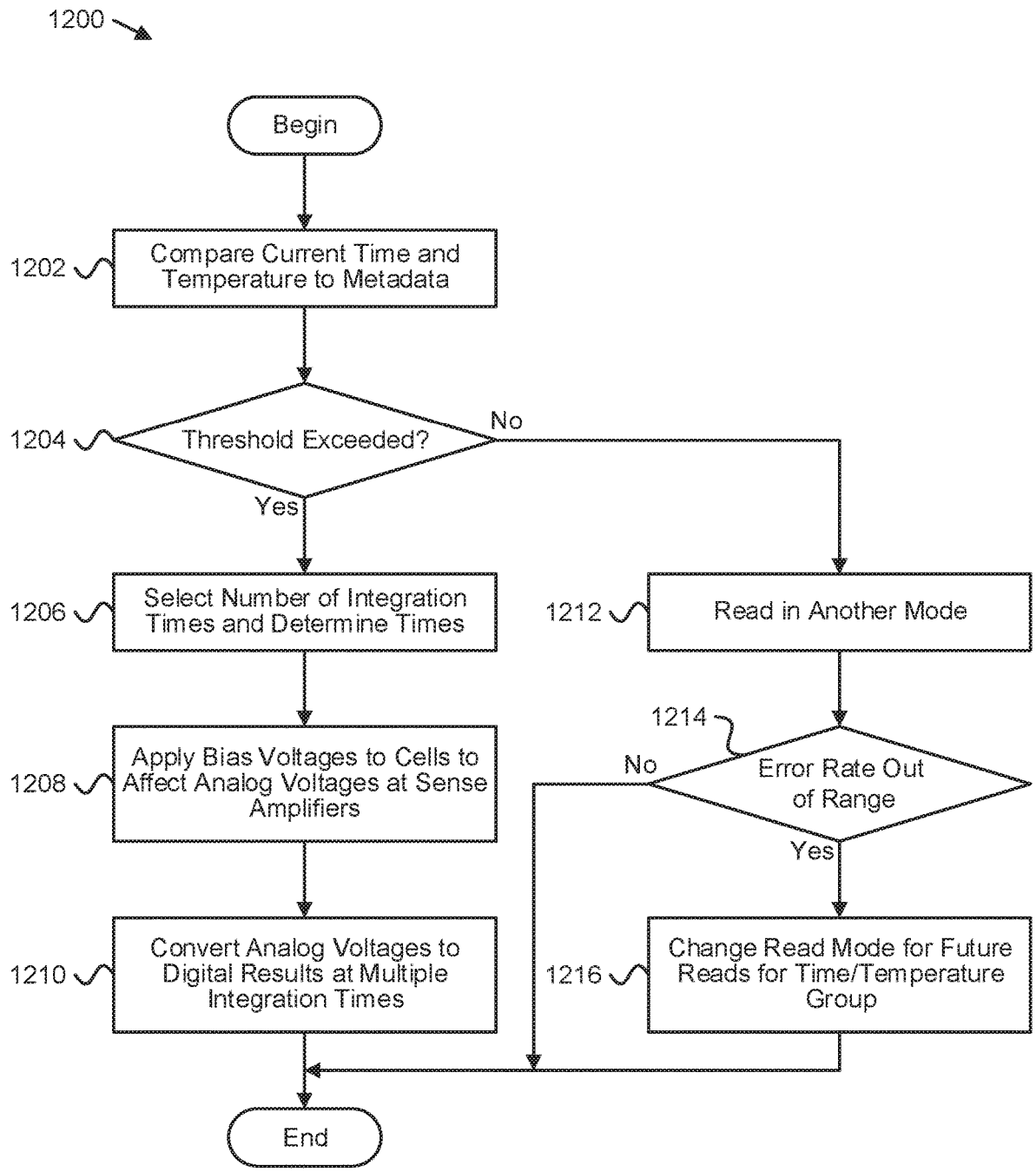
FIG. 12 is a flow chart illustrating another embodiment of a method for reading data.

FIG. 12 is a flow chart illustrating another embodiment of a method 1200 for reading data from a region of non-volatile memory. The method 1200 begins and a read mode module 902 compares 1202 current time and temperature (e.g., from the current conditions module 1014) to metadata for the region (e.g., from the metadata module 1010). The read mode module 902 determines 1204 whether a time difference or a temperature difference exceed a threshold. If the time or temperature threshold is exceeded, the integration time select module 1008 selects 1206 a number of integration times, and determines the integration times. A bias module 904 applies 1208 a set of bias voltages to cells of the region so that states of the cells affect analog voltages at sense amplifiers 700 associated with the cells. A sense module 906 reads hard bits and soft bits for the region by converting 1210 the analog voltages affected by the applied bias voltages to digital sense amplifier results, at multiple integration times, and the method 1200 ends.

If the time or temperature threshold is not exceeded, a read component 150 reads 1212 data from the region in another read mode. The error correction module 1012 determines 1214 whether an error rate is out of range (e.g., below a threshold for using a lower-latency, lower-reliability read mode, or above a threshold for using a higher-latency, higher-reliability read mode). If the error rate is not out of range, the method 1200 ends. If the error rate is out of range, the read mode module 902 changes 1216 the read mode for future reads for a group of regions defined based on time and/or temperature metadata, and the method 1200 ends Means for selecting a read mode from a plurality of read modes for reading data from a region of non-volatile memory, in various embodiments, may include a read mode module 902, a read component 150, a die controller 206, a device controller 126, and/or other logic or electronic hardware. Other embodiments may include similar or equivalent means for selecting a read mode.

Means for producing analog voltages based on data stored by cells of a region of non-volatile memory, in various embodiments, may include a bias module 904, a read component 150, bit line bias/sense circuits 302, word line bias circuits 308, source bias circuits 314, a sense amplifier 700, a current to voltage conversion circuit 702, a capacitor 804, a die controller 206, and/or other logic or electronic hardware. Other embodiments may include similar or equivalent means for producing analog voltages based on stored data.

Means for digitizing analog voltages at a number of integration times based on the selected read mode, in various embodiments, may include a sense module 906, a read component 150, a die controller 206, a sense amplifier 700, a voltage to digital conversion circuit 706, a sense transistor 806, and/or other logic or electronic hardware. Other embodiments may include similar or equivalent means for digitizing analog voltages.

Means for comparing a current time and temperature to time and temperature metadata recorded at write time for a region of non-volatile memory, in various embodiments, may include a read mode module 902, a metadata module 1010, a current conditions module 1014, a read component 150, a die controller 206, a device controller 126, and/or other logic or electronic hardware. Other embodiments may include similar or equivalent means for comparing times and temperatures.

Means for determining integration times, in various embodiments, may include an integration time select module 1008, a metadata module 1010, a current conditions module 1014, an error correction module 1012, a read component 150, a die controller 206, a device controller 126, and/or other logic or electronic hardware. Other embodiments may include similar or equivalent means for determining integration times.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus, comprising:
   an array of non-volatile memory cells; and
   a controller configured to:
   select a read mode from a plurality of read modes for reading data from a region of the array, the plurality of read modes comprising at least a time-based soft bit read mode;
   apply a set of bias conditions to cells of the region such that bit line currents associated with the cells of the region affect voltages at capacitors associated with the cells of the region; and
   in response to selecting the time-based soft bit read mode, read hard bits and soft bits for the region by sensing the capacitor voltages resulting from the applied set of bias conditions, at multiple integration times.

2. The apparatus of claim 1, wherein:
   the plurality of read modes further comprises a hard bit read mode and a bias-based soft bit read mode; and
   the controller is further configured to:
   in response to selecting the hard bit read mode, read hard bits for the region by sensing the capacitor voltages resulting from the applied set of bias conditions, at a single integration time; and
   in response to selecting the bias-based soft bit read mode, read hard bits and soft bits for the region by sensing the capacitor voltages resulting from the applied set of bias conditions, applying one or more additional sets of bias conditions, and sensing the capacitor voltages resulting from the one or more additional sets of bias conditions.

3. The apparatus of claim 1, wherein the time-based soft bit read mode is a default read mode for the controller.

4. The apparatus of claim 1, wherein the controller is configured to sense capacitor voltages at two integration times in the time-based soft bit read mode, and to sense capacitor voltages at three integration times in a second time-based soft bit read mode.

5. The apparatus of claim 1, wherein the controller is configured to select the read mode based on information included in a read command received by the controller.

6. The apparatus of claim 1, wherein the multiple integration times comprise a set of times selected by the controller based on information included in a read command received by the controller.

7. The apparatus of claim 1, wherein the controller is configured to select the read mode based on metadata recorded at write time for the region.

8. The apparatus of claim 1, wherein the controller is configured to select the read mode based on a comparison of the current time and temperature to time and temperature metadata recorded at write time for the region.

9. The apparatus of claim 1, wherein the controller is configured to select the read mode based on error correction information for the region.

10. The apparatus of claim 1, wherein the controller is configured to select the read mode based on error correction information for a second region of the array, and on metadata recorded at write time for the region and the second region.

11. The apparatus of claim 1, wherein the multiple integration times comprise a set of times selected by the controller based on one or more of: metadata for the region, error correction information for the region, error correction information for a second region of the array, and metadata recorded at write time for the second region.

12. A method, comprising:
   determining whether to use a time-based soft bit read mode for reading data from a region of non-volatile memory;
   applying a set of bias voltages to cells of the region such that states of the cells affect analog voltages at sense amplifiers associated with the cells; and
   in response to determining to use the time-based soft bit read mode, reading hard bits and soft bits for the region by converting the analog voltages affected by the applied bias voltages to digital sense amplifier results, at multiple integration times.

13. The method of claim 12, further comprising selecting whether to convert the analog voltages to digital sense amplifier results at two integration times or at three integration times.

14. The method of claim 12, further comprising determining the multiple integration times based on one or more of: metadata for the region, error correction information for the region, error correction information for a second region of the non-volatile memory, and metadata recorded at write time for the second region.

15. The method of claim 12, wherein determining whether to use a time-based soft bit read mode comprises comparing a current time and temperature to time and temperature metadata recorded at write time for the region.

16. The method of claim 12, wherein determining whether to use a time-based soft bit read mode is based on error correction information for the region.

17. The method of claim 12, wherein determining whether to use a time-based soft bit read mode is based on error correction information for a second region of the non-volatile memory, and on metadata recorded at write time for the region and the second region.

18. An apparatus, comprising:
means for selecting a read mode from a plurality of read modes for reading data from a region of non-volatile memory, the plurality of read modes comprising at least a time-based soft bit read mode;
means for producing analog voltages based on data stored by cells of the region; and
means for digitizing the analog voltages at a number of integration times based on the selected read mode.

19. The apparatus of claim 18, wherein the means for selecting a read mode comprises comprising means for comparing a current time and temperature to time and temperature metadata recorded at write time for the region.

20. The apparatus of claim 18, further comprising means for determining the integration times based on one or more of: metadata for the region, error correction information for the region, error correction information for a second region of the non-volatile memory, and metadata recorded at write time for the second region.

* * * * *